United States Patent
Fukuzawa et al.

(10) Patent No.: US 7,808,412 B2
(45) Date of Patent: Oct. 5, 2010

(54) INTEGRATED CIRCUIT DEVICE AND ELECTRONIC INSTRUMENT

(75) Inventors: Akihiro Fukuzawa, Hino (JP); Satoru Ito, Okaya (JP); Nobuyuki Imai, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 63 days.

(21) Appl. No.: 12/389,916

(22) Filed: Feb. 20, 2009

(65) Prior Publication Data
US 2009/0212867 A1 Aug. 27, 2009

(30) Foreign Application Priority Data
Feb. 21, 2008 (JP) .............................. 2008-040264

(51) Int. Cl.
*H03M 1/00* (2006.01)
(52) U.S. Cl. ...................... 341/139; 341/118; 341/120; 341/155
(58) Field of Classification Search ................. 341/118, 341/139
See application file for complete search history.

(56) References Cited

U.S. PATENT DOCUMENTS

| | | | |
|---|---|---|---|
| 5,704,368 A | | 1/1998 | Asano et al. |
| 6,215,433 B1 * | | 4/2001 | Sonu et al. .................. 341/155 |
| 6,369,741 B1 * | | 4/2002 | Demicheli et al. ........... 341/155 |
| 6,744,390 B1 * | | 6/2004 | Stice .......................... 341/120 |
| 6,996,488 B2 * | | 2/2006 | Chu et al. .................... 702/107 |

FOREIGN PATENT DOCUMENTS

| JP | A-8-585 | 1/1996 |
|---|---|---|
| JP | A-2002-261612 | 9/2002 |
| JP | A-2007-117586 | 5/2007 |
| JP | A-2007-285745 | 11/2007 |

OTHER PUBLICATIONS

New U.S. Patent Application filed on Feb. 20, 2009 in the name of Fukuzawa et al.
U.S. Appl. No. 12/338,547, filed Dec. 18, 2008 in name of Fukuzawa et al.
U.S. Appl. No. 12/343,796, filed Dec. 24, 2008 in name of Fukuzawa et al.

* cited by examiner

*Primary Examiner*—Khai M Nguyen
(74) *Attorney, Agent, or Firm*—Oliff & Berridge, PLC

(57) ABSTRACT

An integrated circuit device includes an amplifier circuit that receives an input signal and performs an offset adjustment corresponding to a DC offset of the input signal and a gain adjustment corresponding to an amplitude of the input signal, a filter that is provided in a subsequent stage of the amplifier circuit, a cut-off frequency of the filter being variably set corresponding to a frequency band of the input signal, an A/D converter that is provided in a subsequent stage of the filter and performs an A/D conversion process on a signal amplified by the amplifier circuit, and a control circuit that sets an offset adjustment of the amplifier circuit, a gain adjustment of the amplifier circuit, and the cut-off frequency of the filter.

17 Claims, 28 Drawing Sheets

FIG. 14

| INPUT SIGNAL | RC FILTER | SCF | | DIGITAL FILTER | |
|---|---|---|---|---|---|
| | fc0 | fc1 | fck1 | fc2 | fck2 |
| 1 | f0 | f11 | fs1 | 1 | fs21 |
| 2 | f0 | f11 | fs1 | 2 | fs21 |
| 4 | f0 | f11 | fs1 | 4 | fs21 |
| 8 | f0 | f11 | fs1 | 8 | fs21 |
| 16 | f0 | f12 | fs1 | 16 | fs22 |
| 32 | f0 | f12 | fs1 | 32 | fs22 |
| 64 | f0 | f13 | fs1 | 64 | fs23 |
| 128 | f0 | f13 | fs1 | 128 | fs23 |
| 256 | f0 | f13 | fs1 | 256 | fs24 |
| 512 | f0 | f13 | fs1 | 512 | fs24 |
| 1024 | f0 | f13 | fs1 | 1024 | fs24 |
| 4000(f14) | f0 | f14 | fs1 | — | — |
| 8000(f15) | f0 | f15 | — | — | — |
| 16000(f0) | f0 | — | — | — | — |
| | FIXED ↑ G1 | FIXED VARIABLE ↑ G2 | VARIABLE FIXED ↑ G3 | FIXED VARIABLE ↑ G4 | VARIABLE VARIABLE ↑ G5 |

FIG. 15

| fck2 | fc2 | | | | |
|---|---|---|---|---|---|
| fs21 | ①  | ②  | ④  | ⑧  | ⑯ |
| fs22 | 4 | 8 | 16 | ㉜ | ㊽ |
| fs23 | 16 | 32 | 64 | (128) | (256) |
| fs24 | 64 | 128 | 256 | (512) | (1024) |

FIG. 17

| RC FILTER | SCF | | DIGITAL FILTER | |
| --- | --- | --- | --- | --- |
| fc0 | fc1 | fck1 | fc2 | fck2 |
| f0 | f11 | fs1 | 1 | fs21 |
| f0 | f11 | fs1 | 2 | fs21 |
| f0 | f11 | fs1 | 4 | fs21 |
| f0 | f11 | fs1 | 8 | fs21 |
| f0 | f11 | fs1 | 16 | fs21 |
| f0 | f12 | fs1 | 32 | fs22 |
| f0 | f12 | fs1 | 64 | fs22 |
| f0 | f13 | fs1 | 128 | fs23 |
| f0 | f13 | fs1 | 256 | fs23 |
| f0 | f13 | fs1 | 512 | fs24 |
| f0 | f14 | fs1 | 1024 | fs24 |
| f0 | f15 | — | — | — |
| f0 | — | — | — | — |

☆ → fc2 = 1Hz CUT OFF
A/D CONVERTER fck1' = fs1 = 128KHz
DIGITAL FILTER fck2 = fs21 = 2KHz
A/D CONVERTER PERFORMS INTERMITTENT OPERATION EVERY fck1'/fck2 = 64 TIMINGS

FIG. 18

| RC FILTER | SCF | | DIGITAL FILTER | |
|---|---|---|---|---|
| fc0 | fc1 | fck1 | fc2 | fck2 |
| f0 | f11 | fs1 | 1 | fs21 |
| f0 | f11 | fs1 | 2 | fs21 |
| f0 | f11 | fs1 | 4 | fs21 |
| f0 | f11 | fs1 | 8 | fs21 |
| f0 | f12 | fs1 | 16 | fs21 |
| f0 | f12 | fs1 | 32 | fs22 |
| f0 | f13 | fs1 | 64 | fs22 |
| f0 | f13 | fs1 | 128 | fs23 |
| f0 | f13 | fs1 | 256 | fs23 ★ |
| f0 | f13 | fs1 | 512 | fs24 |
| f0 | f14 | fs1 | 1024 | fs24 |
| f0 | f15 | — | — | — |
| f0 | — | — | — | — |

★ fc2 = 256Hz CUT OFF
A/D CONVERTER fck1' = fs1 = 128KHz
DIGITAL FILTER fck2 = fs23 = 32KHz
A/D CONVERTER PERFORMS INTERMITTENT OPERATION EVERY fck1'/fck2 = 4 TIMINGS

FIG. 19

| RC FILTER | SCF | | DIGITAL FILTER | |
|---|---|---|---|---|
| fc0 | fc1 | fck1 | fc2 | fck2 |
| f0 | f11 | fs1 | 1 | fs21 |
| f0 | f11 | fs1 | 2 | fs21 |
| f0 | f11 | fs1 | 4 | fs21 |
| f0 | f11 | fs1 | 8 | fs21 |
| f0 | f12 | fs1 | 16 | fs22 |
| f0 | f12 | fs1 | 32 | fs22 |
| f0 | f13 | fs1 | 64 | fs23 |
| f0 | f13 | fs1 | 128 | fs23 |
| f0 | f13 | fs1 | 256 | fs24 |
| f0 | f13 | fs1 | 512 | fs24 |
| f0 | f14 | fs1 | 1024 | — |
| f0 | f15 | — | — | — |

☆ → fc2 = 512Hz CUT OFF
A/D CONVERTER fck1' = fs1 = 128KHz
DIGITAL FILTER fck2 = fs24 = 128KHz
A/D CONVERTER OPERATES NORMALLY FIG. 24A
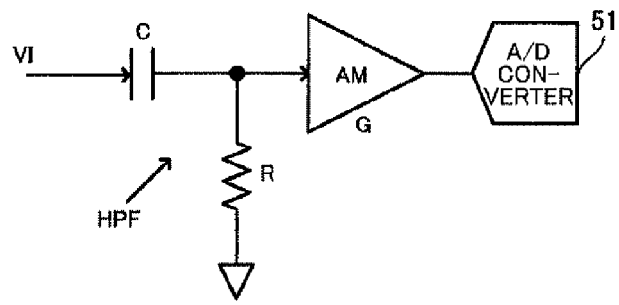
FIG. 24B
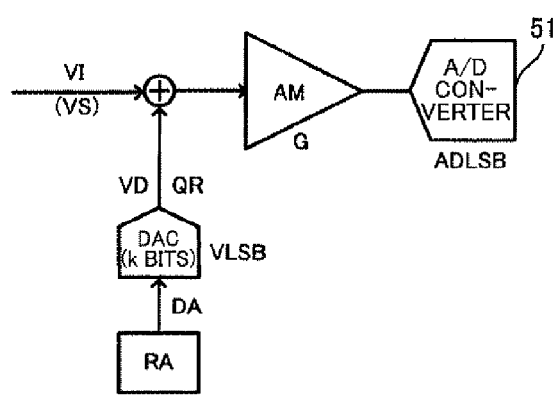
FIG. 24C
|  | HPF | SINGLE-STAGE AMPLIFIER/SINGLE-STAGE DAC | MULTI-STAGE AMPLIFIER/MULTI-STAGE DAC |
|---|---|---|---|
| CALIBRATION RESPONSE SPEED | × | ○ | ○ |
| SIZE | × | × | ○ |
| ACCURACY | ○ | × | ○ |
FIG. 24D
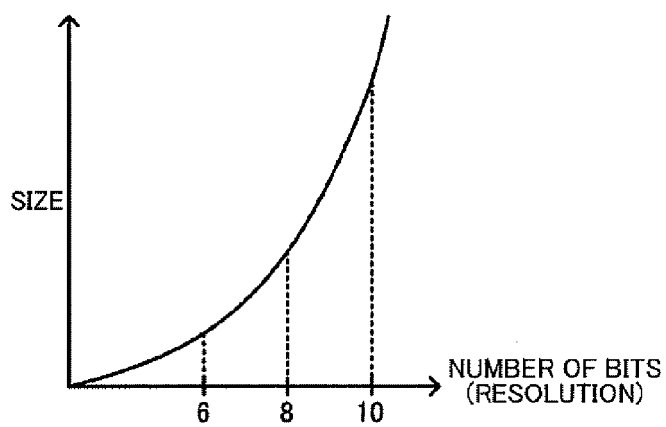

FIG. 25A SINGLE-STAGE AMPLIFIER/SINGLE-STAGE DAC

| RESOLUTION (NUMBER OF BITS) | OUTPUT RANGE | DAC ACCURACY (1LSB-EQUIVALENT VOLTAGE) |
|---|---|---|
| 15 BITS | 3V | 93.75 μV |

FIG. 25B

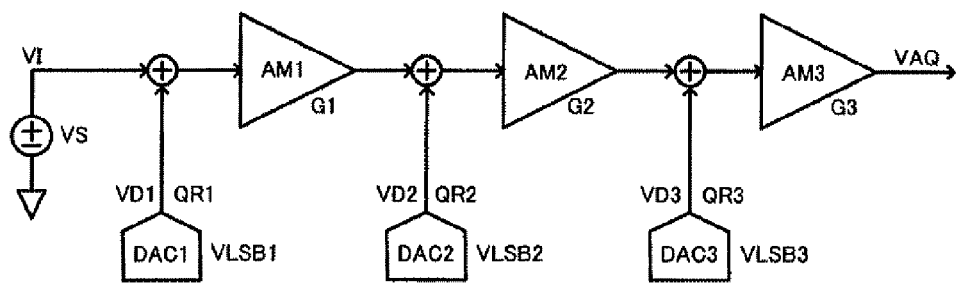

$$VAQ = G1 \times G2 \times G3 \times VS + G1 \times G2 \times G3 \times VD1 + G2 \times G3 \times VD2 + G3 \times VD3$$

$$VS = -\left(VD1 + \frac{VD2}{G1} + \frac{VD3}{G1 \times G2}\right)$$

FIG. 25C MULTI-STAGE AMPLIFIER/MULTI-STAGE DAC

| DAC | RESOLUTION (NUMBER OF BITS) | OUTPUT RANGE | DAC ACCURACY (1LSB-EQUIVALENT VOLTAGE) |
|---|---|---|---|
| DAC1 | 5 | 3V (QR1) | 96mV (VLSB1) |
| DAC2 | 5 | 0.384V (QR2) | 12mV (VLSB2) |
| DAC3 | 5 | 48mV (QR3) | 1.5mV (VLSB3) |

G1=4, G2=4, G3=2

QR1 > QR2 > QR3

VLSB1 > VLSB2 > VLSB3

INTEGRATED CIRCUIT DEVICE AND ELECTRONIC INSTRUMENT

Japanese Patent Application No. 2008-040264 filed on Feb. 21, 2008, is hereby incorporated by reference in its entirety.

BACKGROUND

The present invention relates to an integrated circuit device, an electronic instrument, and the like.

In order to implement a ubiquitous network society, a sensor network that is formed by connecting a plurality of sensors through a network and acquires information from each sensor to comprehensively determine the situation is necessary. Such a sensor network utilizes various sensors such as a temperature sensor, a smoke sensor, an optical sensor, a human detection sensor, a pressure sensor, a biosensor, and a gyrosensor. A sensor detection signal varies in amplitude, DC offset, frequency band, and the like corresponding to the type of sensor.

Since the sensor detection signal (sensor signal) is an analog signal, the analog sensor detection signal must be converted into digital data in order to analyze and determine information using a CPU or the like. For example, JP-A-2007-117586 and JP-A-2007-285745 disclose A/D converters that convert an analog detection signal output from a sensor into digital data.

However, an integrated circuit device (IC) that includes such an A/D converter has been generally developed as a sensor-specific integrated circuit device. Therefore, when a new sensor has been developed, an integrated circuit device for the new sensor must be developed and produced by way of trial. This process is very expensive. In this case, a general-purpose integrated circuit device may be used. However, since a sensor detection signal varies in frequency band, amplitude, and DC offset corresponding to the type of sensor, it is substantially impossible to deal with a new sensor using a general-purpose integrated circuit device. Therefore, the user cannot easily produce an integrated circuit device for various sensors by way of trial.

SUMMARY

According to one aspect of the invention, there is provided an integrated circuit device comprising:

an amplifier circuit that receives an input signal and performs an offset adjustment corresponding to a DC offset of the input signal and a gain adjustment corresponding to an amplitude of the input signal;

a filter that is provided in a subsequent stage of the amplifier circuit, a cut-off frequency of the filter being variably set corresponding to a frequency band of the input signal;

an A/D converter that is provided in a subsequent stage of the filter and performs an A/D conversion process on a signal amplified by the amplifier circuit; and a control circuit that sets an offset adjustment of the amplifier circuit, a gain adjustment of the amplifier circuit, and the cut-off frequency of the filter.

According to another aspect of the invention, there is provided an electronic instrument comprising the above integrated circuit device.

BRIEF DESCRIPTION OF THE DRAWINGS

FIG. 14 shows a setting example of the cut-off frequency and the sampling frequency of each filter.

FIG. 15 shows the relationship between the sampling frequency and the cut-off frequency of a digital filter.

FIG. 17 is a view illustrative of frequency setting during an intermittent operation of an A/D converter.

FIG. 18 is a view illustrative of frequency setting during an intermittent operation of an A/D converter.

FIG. 19 is a view illustrative of frequency setting during an intermittent operation of an A/D converter

FIGS. 24A to 24D are views illustrative of the advantages of a multi-stage amplifier/multi-stage DAC configuration.

FIGS. 25A to 25C are views illustrative of the advantages of a multi-stage amplifier/multi-stage DAC configuration.

DESCRIPTION OF EXEMPLARY EMBODIMENTS

Figure 1:
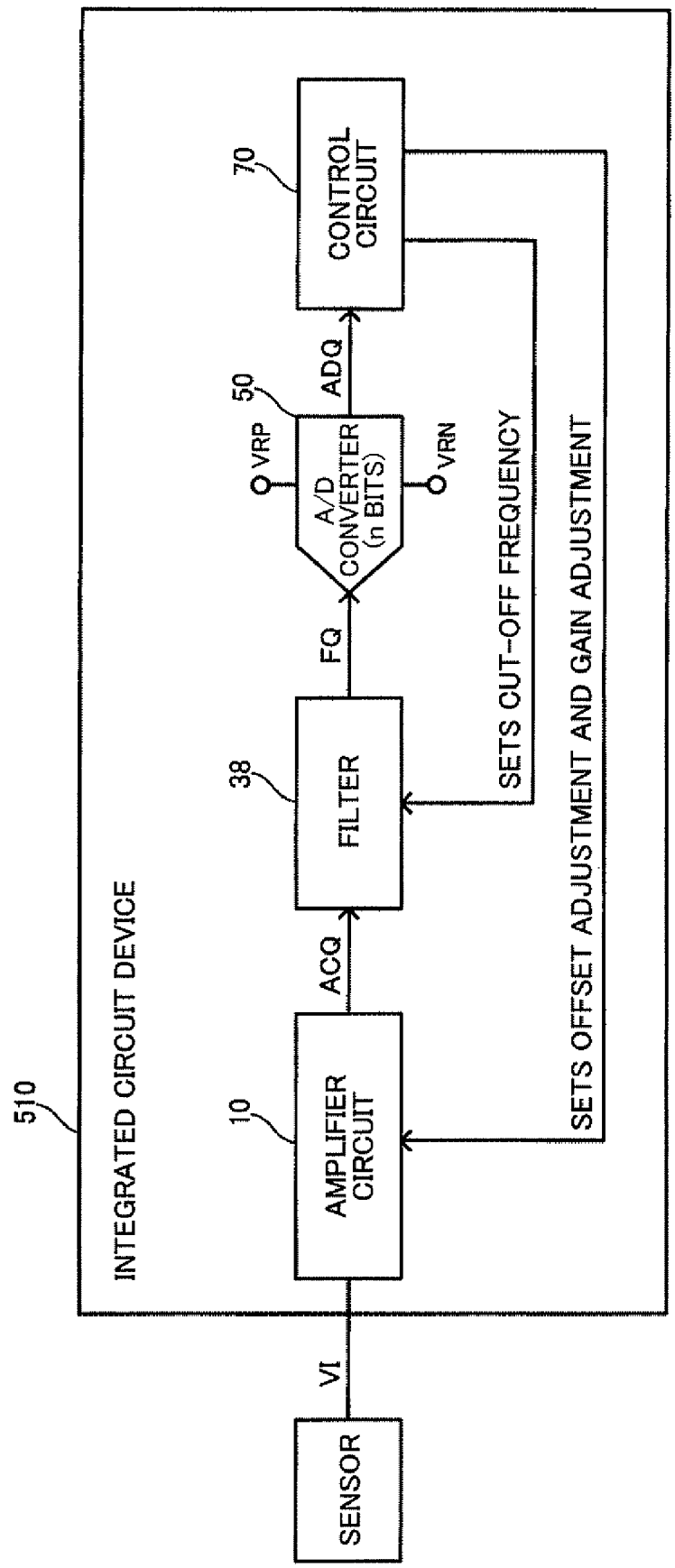
FIG. 1 shows a configuration example of an integrated circuit device according to one embodiment of the invention.

Several aspects of the invention may provide an integrated circuit device that can perform an A/D conversion process corresponding to an input signal that varies in frequency band, amplitude, DC offset, and the like, and an electronic instrument including the same.

According to one embodiment of the invention, there is provided an integrated circuit device comprising:

an amplifier circuit that receives an input signal and performs an offset adjustment corresponding to a DC offset of the input signal and a gain adjustment corresponding to an amplitude of the input signal;

a filter that is provided in a subsequent stage of the amplifier circuit, a cut-off frequency of the filter being variably set corresponding to a frequency band of the input signal;

an A/D converter that is provided in a subsequent stage of the filter and performs an A/D conversion process on a signal amplified by the amplifier circuit; and a control circuit that sets an offset adjustment of the amplifier circuit, a gain adjustment of the amplifier circuit, and the cut-off frequency of the filter.

According to this embodiment, an offset adjustment and a gain adjustment of the amplifier circuit and the cut-off frequency of the filter are set under control of the control circuit Therefore, an offset adjustment corresponding to the DC offset of the input signal, a gain adjustment corresponding to the amplitude of the input signal, and the cut-off frequency of the filter corresponding to the frequency band of the input signal can be set, and an A/D conversion process is performed on a signal for which the offset adjustment, the gain adjustment, and the cut-off frequency have been set. Therefore, an integrated circuit device that can deal with an input signal that varies in DC offset, amplitude, and frequency band can be provided.

In the integrated circuit device, first to Mth (M is an integer equal to or larger than two) amplifier circuits may be provided as the amplifier circuit, the first to Mth amplifier circuits respectively receiving first to Mth input signals, each of the first to Mth amplifier circuits performing an offset adjustment corresponding to a DC offset of a corresponding input signal among the first to Mth input signals and a gain adjustment corresponding to an amplitude of a corresponding input signal among the first to Mth input signals;

first to Mth filters may be provided as the filter, cut-off frequencies of the first to Mth filters being variably set corresponding to frequency bands of the first to Mth input signals, respectively; and the integrated circuit device may further comprise a multiplexer that selects an output signal from output signals from the first to Mth filters and outputs the selected output signal to the A/D converter as a multiplexer output signal.

According to the above configuration, the multiplexer can output the filter output signals corresponding to the first to Mth input signals to the A/D converter by time division, and the A/D converter can perform an A/D conversion process on the filter output signals output by time division, for example. This makes it possible to subject the first to M input signals that differ in DC offset, amplitude, and frequency band to A/D conversion using a single integrated circuit device, for example. Therefore, convenience to the user can be improved. Moreover, since the first to M input signals can be integrally subjected to A/D conversion and digital processing, the processing efficiency can be improved.

In the integrated circuit device, the amplifier circuit may perform a filter process on the input signal as a continuous-time filter; and the filter may be a switched-capacitor filter that performs a filter process using the continuous-time filter as a prefilter.

According to the above configuration, the amplifier circuit that amplifies the input signal can be effectively utilized as the continuous-time filter that functions as a prefilter for the switched-capacitor filter.

In the integrated circuit device, when a sampling frequency of the switched-capacitor filter is referred to as fck1, a cut-off frequency of the switched-capacitor filter is referred to as fc1, a resolution of the A/D converter is n bits, and an attenuation factor of the continuous-time filter at a frequency fck1−fc1 is AT1 dB, the relationship "AT1≦20×log(1/2$^n$)" may be satisfied.

According to the above configuration, a harmonic signal that causes a folding noise due to the switched-capacitor filter can be attenuated to a voltage equal to or lower than the 1LSB-equivalent voltage of the A/D converter, for example.

In the integrated circuit device, a cut-off frequency fc0 of the continuous-time filter may be fixed; and a cut-off frequency fc1 of the switched-capacitor filter may be variably set.

Since it is unnecessary to provide external elements by fixing the cut-off frequency fc0, for example, convenience can be improved.

In the integrated circuit device, a sampling frequency fck1 of the switched-capacitor filter may be fixed; and a cut-off frequency fc1 of the switched-capacitor filter may be variably set.

Since the frequency in the folding band does not change when fixing the sampling frequency fck1, the filter frequency characteristics can be easily designed.

In the integrated circuit device, the cut-off frequency fc1 of the switched-capacitor filter may be variably set by changing a capacitance ratio of a plurality of capacitors included in the switched-capacitor filter.

According to the above configuration, the cut-off frequency fc1 can be variably set while suppressing an increase in circuit scale.

In the integrated circuit device, the control circuit may include a digital filter that performs a digital filter process using the continuous-time filter and the switched-capacitor filter as prefilters, a cut-off frequency of the digital filter being variably set corresponding to the frequency band of the input signal.

According to the above configuration, the continuous-time filter and the switched-capacitor filter can be effectively utilized as prefilters for the digital filter. Since the cut-off frequencies of the switched-capacitor filter and the digital filter are variably set corresponding to the frequency band of the input signal, an integrated circuit device that can deal with an input signal that varies in frequency band can be provided.

In the integrated circuit device, when a cut-off frequency of the continuous-time filter is referred to as fc0, a cut-off frequency of the switched-capacitor filter is referred to as fc1, and the cut-off frequency of the digital filter is referred to as fc2, the relationship "fc0>fc1>fc2" may be satisfied.

According to the above configuration, a variable filter function that deals with an input signal that varies in frequency band can be implemented by a small configuration.

In the integrated circuit device, when a sampling frequency of the digital filter is referred to as fck2, the cut-off frequency of the digital filter is referred to as fc2, and a resultant attenuation factor of the continuous-time filter and the switched-capacitor filter at a frequency fck2−fc2 is AT2 dB, the relationship "AT2≦20×log(1/2$^n$)" may be satisfied.

According to the above configuration, a harmonic signal that causes a folding noise due to the digital filter can be attenuated to a voltage equal to or lower than the 1LSB-equivalent voltage of the A/D converter, for example, In the integrated circuit device, a sampling frequency fck2 of the digital filter may be set so that the sampling frequency fck2 decreases as a cut-off frequency fc1 of the switched-capacitor filter decreases.

According to the above configuration, the sampling frequency fck2 of the digital filter can be reduced by reducing the cut-off frequency fc1 of the switched-capacitor filter corresponding to the frequency band of the input signal, for example. Therefore, unnecessary power consumption and the like can be prevented.

In the integrated circuit device, a cut-off frequency fc2 of the digital filter may be set so that the cut-off frequency fc2 decreases as the frequency band of the input signal decreases.

According to the above configuration, the cut-off frequency fc2 of the digital filter can be reduced corresponding to the frequency band of the input signal, for example. Therefore, unnecessary power consumption and the like can be prevented.

In the integrated circuit device, the amplifier circuit may include first to Nth (N is an integer equal to or larger than two) amplifiers that are cascaded;

the integrated circuit device may further comprise first to Nth D/A converters that are provided corresponding to the first to Nth amplifiers and used to perform an offset adjustment of the first to Nth amplifiers; and the control circuit may set an offset adjustment of the first to Nth amplifiers using the first to Nth D/A converters and setting a gain adjustment of the first to Nth amplifiers.

According to this embodiment, the first to Nth multi-stage D/A converters used to perform an offset adjustment are provided corresponding to the first to Nth amplifiers of the amplifier circuit. The control circuit sets an offset adjustment of the first to Nth amplifiers using the first to Nth D/A converters and a gain adjustment of the first to Nth amplifiers. According to this embodiment, an offset adjustment and a gain adjustment are implemented by utilizing the multi-stage amplifier/multi-stage DAC configuration. Therefore, an accurate offset adjustment and the like can be implemented while suppressing an increase in circuit scale as compared with the case of using a single-stage amplifier/single-stage DAC configuration.

In the integrated circuit device, an output range QR1 of an ith (i is an integer that satisfies 1≦i<N) D/A converter among the first to Nth D/A converters may be wider than an output range QR2 of an (i+1)th D/A converter among the first to Nth D/A converters that is provided in a subsequent stage of the ith D/A converter.

When the output range QR1 of the ith D/A converter is set to be wider than the output range QR2 of the (i+1)th D/A converter, the DC offset and the like of the input signal can be roughly corrected by the ith f/A converter having a wide output range QR1, and an error value that has not been removed by correction can be corrected by the subsequent-stage (i+1)th D/A converter having a narrow output range QR2. This enables an efficient offset adjustment.

In the integrated circuit device, when a gain of an ith amplifier among the first to Nth amplifiers is referred to as G1 and a 1LSB-equivalent voltage of the ith D/A converter is referred to as VLSB1, QR2≧G1× VLSB1 maybe satisfied.

This prevents a situation in which an error value that has not been removed by the ith D/A converter is amplified by the ith amplifier and exceeds the output range QR2 of the (i+1)th D/A converter, In the integrated circuit device, a 1LSB-equivalent voltage VLSB1 of an ith (i is an integer that satisfies 1≦i<N) D/A converter among the first to Nth D/A converters may be higher than a 1LSB-equivalent voltage VLSB2 of an (i+1)th D/A converter among the first to Nth D/A converters that is provided in a subsequent stage of the ith D/A converter.

According to the above configuration, an error value that has not been removed by the ith D/A converter can be removed by the subsequent-stage (i+1)th D/A converter that has a 1LSB-equivalent voltage lower than (i.e., has a D/A conversion accuracy higher than) that of the ith D/A converter. Therefore, a more accurate offset adjustment and the like can be implemented.

According to another embodiment of the invention, there is provided an electronic instrument comprising one of the above integrated circuit devices.

Preferred embodiments of the invention are described in detail below. Note that the following embodiments do not in any way limit the scope of the invention defined by the claims laid out herein. Note that all elements of the following embodiments should not necessarily be taken as essential requirements for the invention.

1. Integrated Circuit Device

FIG. 1 shows a configuration example of an integrated circuit device according to one embodiment of the invention. The integrated circuit device (analog front-end circuit) includes an amplifier circuit 10, a filter 38, an A/D converter 50, and a control circuit 70. Note that the integrated circuit device according to this embodiment is not limited to the configurations shown in FIG. 1. Various modifications may be made such as omitting some of the elements or adding other elements.

The amplifier circuit 10 receives an input signal VI, amplifies the input signal VI, and outputs an amplified signal ACQ. The amplifier circuit 10 has an offset adjustment function and a gain adjustment function. Specifically, the amplifier circuit 10 performs an offset adjustment corresponding to the DC offset of the input signal VI and a gain adjustment corresponding to the amplitude of the input signal VI.

The filter 38 is provided in the subsequent stage of the amplifier circuit 10, and performs a filter process such as a low-pass filter (LPF) process. Specifically, the filter 38 is provided between the amplifier circuit 10 and the A/D converter 50, for example. The cut-off frequency of the filter 38 is variably set corresponding to the frequency band of the input signal VI, for example. Specifically, the cut-off frequency of the filter 38 is reduced as the frequency band (passband cut-off frequency) of the input signal VI decreases.

The A/D converter 50 performs an A/D conversion process on a signal amplified by the amplifier circuit 10. Specifically, a high-potential-side reference voltage VRP and a low-potential-side reference voltage VRN that specify (set) the input voltage range of the A/D converter 50 are supplied to the A/D converter 50. The A/D converter 50 performs the A/D conversion process at a resolution of n bits (e.g., n=10) in the input voltage range specified by the high-potential-side reference voltage VRP and the low-potential-side reference voltage VRN, and outputs digital data ADQ (digital output value) obtained by the A/D conversion process. For example, the VD converter 50 samples/holds the signal AQ3 output from the amplifier circuit 10 using an A/D conversion sampling clock signal, and performs the A/D conversion process on the sampled/held signal.

A successive approximation type A/D converter may be used as the A/D converter 50, for example. In this case, the A/D converter 50 may include a sample-hold circuit, a comparator, a successive approximation register, and a D/A converter (not shown). The comparator compares an analog signal obtained by a D/A conversion process and output from the D/A converter with a sampled/held signal output from the sample-hold circuit. The successive approximation register stores data relating to an output signal from the comparator. The D/A converter performs a D/A conversion process on the digital data output from the successive approximation register, and outputs the resulting analog signal. Note that the A/D converter 50 is not limited to the successive approximation type A/D converter, but may be a parallel comparison type A/D converter, a servo-balancing type A/D converter, or the like.

The control circuit 70 (control section, processing section, or calculation section) controls each circuit of the integrated circuit device. The control circuit 70 may be implemented by a logic circuit (e.g., gate array), a processor (e.g., CPU), or the like. The control circuit 70 sets an offset adjustment and a gain adjustment of the amplifier circuit 10. The control circuit 70 also sets the cut-off frequency of the filter 38.

Specifically, the amplifier circuit 10 includes at least one amplifier, for example. An offset adjustment can be implemented by adding the voltage input to the amplifier to a voltage obtained by subjecting the offset adjustment data from the control circuit 70 to D/A is conversion. A gain adjustment can be implemented by adjusting the resistance of a resistor (i.e., element value of a passive element) included in the amplifier based on gain adjustment data from the control circuit 70.

The control circuit 70 includes an internal register in which the cut-off frequency (sampling frequency) is set, for example. An external instrument (erg., software or firmware that controls an electronic instrument) sets the cut-off frequency (sampling frequency) in the internal register through an interface (not shown). The control circuit 70 instructs the filter 38 to set the cut-off frequency (sampling frequency) based on the data set in the internal register. Therefore, the filter 38 performs the filter process based on the cut-off frequency.

According to the above-described embodiment, an offset adjustment, a gain adjustment, and a filter band can be variably set under control of the control circuit 70. Specifically, an offset adjustment corresponding to the DC offset of the input signal VI, a gain adjustment corresponding to the amplitude of the input signal VI, and the cut-off frequency of the filter corresponding to the frequency band (passband) of the input signal VI can be set.

For example, since the DC offset, amplitude, frequency band, and the like of an input signal utilized in a related-art integrated circuit device that includes an A/D converter have been determined to a certain extent corresponding to the specification and the like, it suffices that the A/D converter perform an A/D conversion process within an input voltage range and a frequency band corresponding to the specification.

Figure 2:
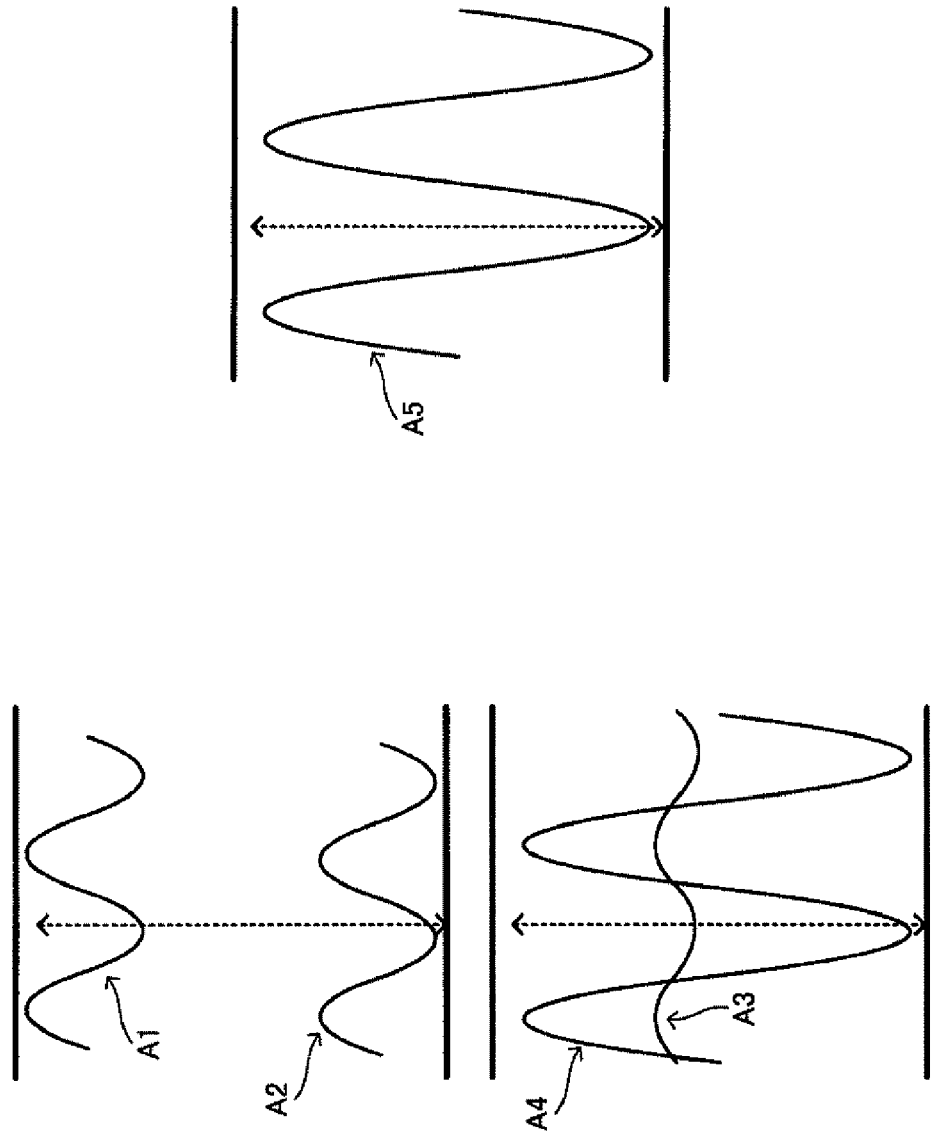
FIG. 2 is a view illustrative of a method that increases the A/D conversion dynamic range.
Figure 3:
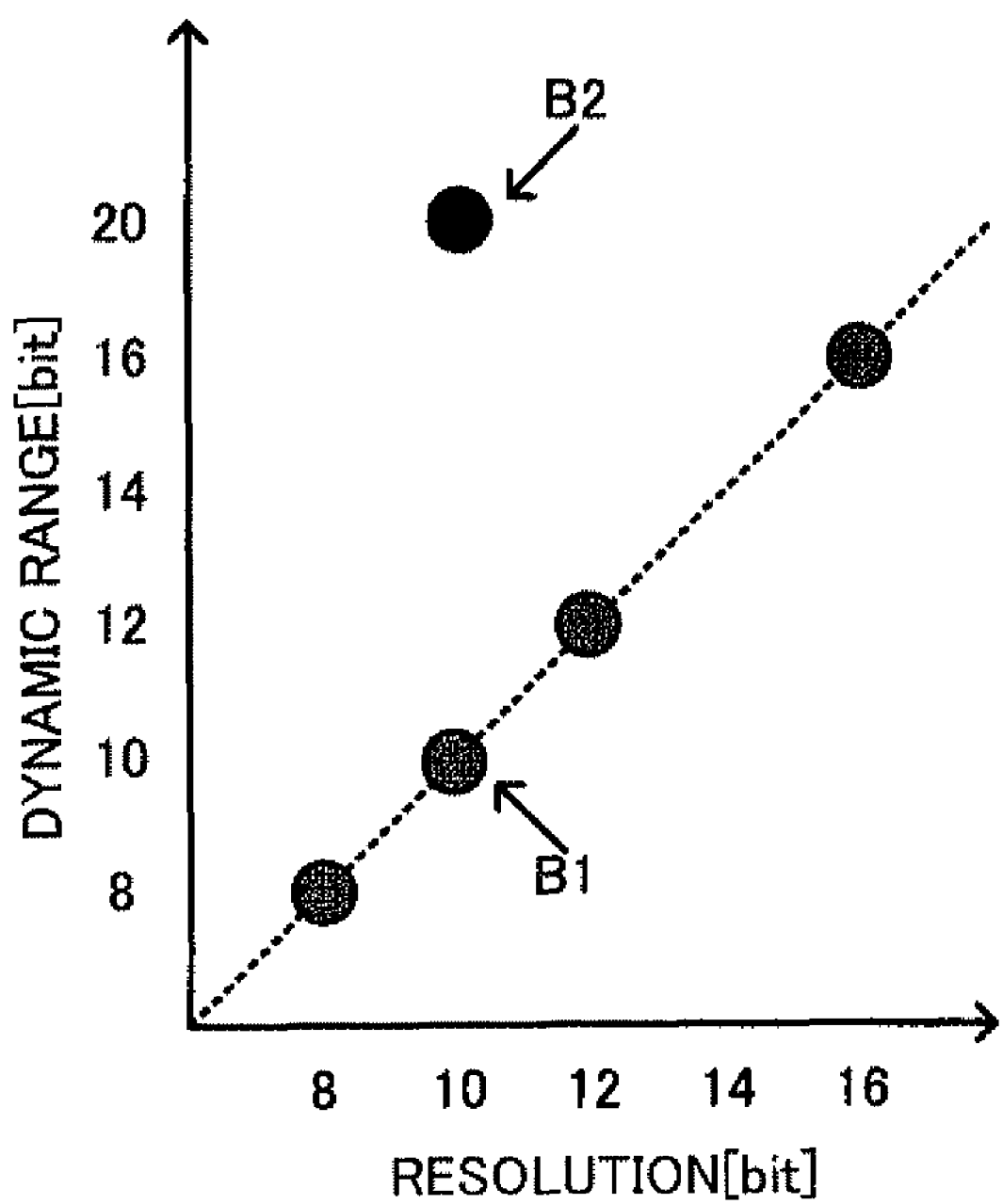
FIG. 3 is a view showing the relationship between a dynamic range and resolution.

However, when performing an A/D conversion process on a detection signal output from a sensor (sensor device) or the like, the DC offset of the input signal VI (detection signal) varies corresponding to the type of sensor, as indicated by A1 and A2 in FIG. 2. The amplitude of the input signal VI also varies corresponding to the type of sensor, as indicated by A3 and A4. Therefore, when performing an A/D conversion process on such an input signal VI, the dynamic range cannot be increased without increasing the A/D conversion resolution, as indicated by B1 in FIG. 3. Specifically, the number of bits of the A/D conversion resolution has been usually increased in order to absorb a change in DC offset, amplitude, and the like of the input signal. However, an increase in the number of bits of the A/D conversion resolution results in an increase in circuit scale, power consumption, and the like. Moreover, design becomes complicated.

According to this embodiment, the DC offset of the input signal VI can also be accurately adjusted by an offset adjustment using the control circuit 70. Therefore, even if the DC offset of the input signal VI has changed as indicated by A1 and A2 in FIG. 2, an offset adjustment that sets the amplitude center (DC offset) of the signal input to the A/D converter 50 at the center of the input voltage range (VRP to VRN) of the A/D converter 50 can be implemented. This significantly increases the dynamic range.

According to this embodiment, the gain of the amplitude of the input signal VI can be accurately adjusted by a gain adjustment using the control circuit 70. Therefore, even if the amplitude of the input signal VI has changed as indicated by A3 and A4 in FIG. 2, the A/D input amplitude (swing level) (i.e., the amplitude of the signal input to the A/D converter 50) can be made almost constant (see A5) irrespective of the amplitude of the input signal VI. This further increases the dynamic range.

For example, when the A/D input amplitude (maximum input amplitude) of the A/D converter is referred to as VAT and the voltage corresponding to the least significant bit (1LSB) of the A/D converter is referred to as VLSB, the dynamic range DR can be expressed by DR=VAT/VLSB.

According to related-art technology, when the amplitude of the input signal VI is small (see A3 in FIG. 2), the A/D input amplitude VAT also decreases. Therefore, in order to increase the dynamic range DR (=VAT/VLSB), it is necessary to increase the number of bits of the A/D conversion resolution to reduce the voltage VLSB (see B1 in FIG. 3). As a result, an increase in the dynamic range DR is limited.

According to this embodiment, even if the amplitude of the input signal VI has changed as indicated by A3 and A4 in FIG. 2, the A/D input amplitude can be maximized (see A5) by a gain adjustment using the amplifier circuit 10. Therefore, the dynamic range DR can be increased without changing the A/D conversion resolution (e.g., 10 bits) (see B2 in FIG. 3).

According to related-art technology, when the input signal VI has a DC offset (see A1 and A2 in FIG. 2), the output of the amplifier is easily saturated due to amplification of the input signal VI. Therefore, the gain of the amplifier cannot be increased so that the input signal VI cannot be amplified sufficiently. As a result, the input voltage range of the signal input to the A/D converter becomes narrower than the original dynamic range DR of the A/D converter so that the substantial dynamic range DR cannot be increased.

According to this embodiment, even if the input signal VI has a DC offset (see A1 and A2 in FIG. 2), the amplitude center of the signal input to the A/D converter 50 can be set at the center of the input voltage range of the A/D converter 50 by an offset adjustment using the amplifier circuit 10, for example. The A/D input amplitude can be maximized (see A5 in FIG. 2) by performing the above-described offset adjustment and gain adjustment. Therefore, the dynamic range DR can be increased without changing the A/D conversion resolution.

When subjecting a detection signal output from a sensor (sensor device) or the like to A/D conversion, the frequency band of the detection signal differs corresponding to the type of sensor. Therefore, it is difficult for a related-art integrated circuit device of which the frequency band of the input signal has been determined by the specification and the like perform an A/D conversion process on a detection signal output from a sensor that varies in frequency band. When developing and producing a new sensor by way of trial, it is necessary to develop an integrated circuit device corresponding to each sensor. This results in an increase in development cost and development period.

According to this embodiment, the cut-off frequency of the filter 38 is variably set corresponding to the frequency band of the input signal VI. Therefore, the cut-off frequency can be variably set in the range between 1 Hz and 16 KHz, for example. This makes it possible to deal with input signals VI in various frequency bands so that a novel integrated circuit device can be provided.

Specifically, it has been difficult to deal with a first type of sensor that outputs a detection signal having a frequency of 1 Hz and a second type of sensor that outputs a detection signal having a frequency of 16 KHz using a single integrated circuit device, for example. This makes it necessary to separately develop an integrated circuit device for the first type of sensor and an integrated circuit device for the second type of sensor.

On the other hand, since the integrated circuit device shown according to this embodiment has a variable filter function, it is possible to deal with the first type of sensor and the second type using a single integrated circuit device. Therefore, an increase in development cost and development period can be prevented.

In the development/trial production stage of a new sensor, for example, the DC offset, the amplitude, and the frequency band of the detection signal output from the sensor may be unknown. According to this embodiment, since an offset adjustment, a gain adjustment, a cut-off frequency setting of the input signal VI (i.e., detection signal output from the sensor) are automatically performed, the user can connect the sensor to the integrated circuit device without taking much account of the DC offset, the amplitude, and the frequency band of the detection signal. Therefore, an integrated circuit device (sensor measurement assistance IC) convenient to the user can be provided. Moreover, since it is unnecessary to produce a new integrated circuit device by way of trial corresponding to the type of sensor, the development cost can be reduced.

2. First Specific Example

Figure 4:
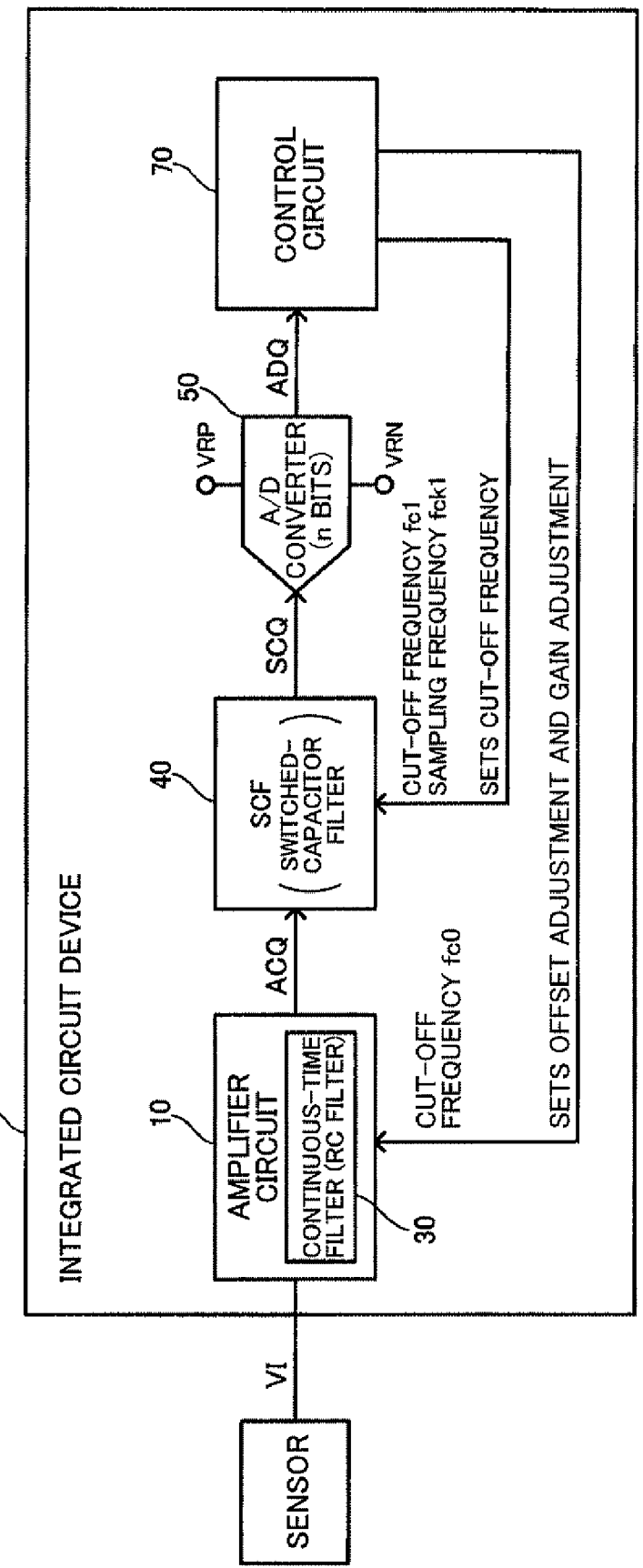
FIG. 4 shows a first specific example of an integrated circuit device according to one embodiment of the invention.

FIG. 4 shows a first specific example of the integrated circuit device according to this embodiment. In the first specific example, the amplifier circuit 10 filters the input signal VI as a continuous-time filter 30. The filter 38 is replaced by a switched-capacitor filter (SCF) 40 that performs a filter process using the continuous-time filter 30 as a prefilter.

The continuous-time filter 30 implemented by the amplifier circuit 10 filters the input signal VI. Specifically, the continuous-time filter 30 performs an Nth-order (N is a natural number) low-pass filtering (LPF) process on the input signal VI. In this case, the cut-off frequency of the continuous-time filter 30 is set at fc0. The continuous-time filter 30 does not produce a folding noise, differing from the SCF 40 that is a discrete-time filter The continuous-time filter 30 is implemented by one or more amplifiers included in the amplifier circuit 10. Specifically, the continuous-time filter 30 that is an RC active filter is implemented by a passive element (e.g., resistor and capacitor) and a active element (e.g., operational amplifier) included in the amplifier. According to this configuration, a continuous-time filter (prefilter for the SCF 40 and the like) can be implemented by effectively utilizing the amplifier circuit 10 that amplifies the input signal. Therefore, the amplifier circuit 10 can be provided with a continuous-time filter function and an input signal amplification function.

The SCF (switched-capacitor filter) 40 is provided in the subsequent stage of the continuous-time filter 30. Specifically, the SCF 40 receives an output signal ACQ from the continuous-time filter 30, performs a filter process (e.g., LPF process) on the output signal ACQ, and outputs a signal SCQ obtained by the filter process to the A/D converter 50. The SCF 40 includes a switch element, an operational amplifier, and a capacitor. The SCF 40 performs a sample-hold operation at a sampling frequency fck1.

The SCF 40 performs the filter process utilizing the continuous-time filter 30 as a prefilter (anti-aliasing filter). Specifically, the SCF 40 performs a filter process that prevents a folding noise that occurs when a harmonic signal folds into the frequency band of the input signal VI from exceeding the 1LSB-equivalent voltage (quantization error voltage) of the A/D converter 50.

The cut-off frequency fc1 of the SCF 40 (first discrete-time filter in a broad sense) is variably set corresponding to the frequency band (passband) of the input signal VI, for example. For example, the cut-off frequency fc1 of the SCF 40 decreases as the frequency band (passband cut-off frequency) of the input signal VI decreases.

For example, when the sampling frequency of the SCF is referred to as fkc1, the resolution of the A/D converter 50 is n bits, and the attenuation factor of the continuous-time filter 10 at a frequency fck1−fc1 is AT1 dB, the relationship "AT1≦20×log(1/2$^n$)" is satisfied.

In FIG. 4, the cut-off frequency fc0 of the continuous-time filter 20 is fixed, and the cut-off frequency fc1 of the SCF 40 is variably set, for example. Specifically, the sampling frequency fck1 of the SCF 40 is fixed, and the cut-off frequency fc1 of the SCF 40 is variably set. The cut-off frequency fc1 of the SCF 40 is variably set based on the capacitance ratio of a plurality of capacitors included in the SCF 40.

The A/D converter 50 is provided in the subsequent stage of the SCF 40. Specifically, the A/D converter 50 receives the output signal SCQ from the SCF 40, A/D-converts the output signal SCQ, and outputs digital data ADQ obtained by A/D conversion to the control circuit 70. The A/D converter 50 performs the A/D conversion operation utilizing the continuous-time filter 30 and the SCF 40 as prefilters.

According to the first specific example shown in FIG. 4, the continuous-time filter 30 functions as a prefilter for the SCF 40, and the continuous-time filter 30 and the SCF 40 function as prefilters for the A/D converter 50. This implements a variable band in a wide range from 1 Hz to 16 KHz, for example.

As a comparative example of this embodiment, only the continuous-time filter 30 may be provided as a prefilter for the A/D converter 50 without providing the SCF 40. According to this comparative example, when using an RC filter as the continuous-time filter 30, the cut-off frequency of the continuous-time filter 30 is determined by the reciprocal of an RC product that is the product of the resistance and the capacitance, for example. Therefore, it is necessary to increase the resistance and the capacitance in order to deal with various frequency bands. This makes it difficult to incorporate the resistor and the capacitor in an integrated circuit device (IC chip). As a result, the resistor and the capacitor must be provided externally.

According to this embodiment, the SCF 40 is provided between the continuous-time filter 30 and the A/D converter 50. The cut-off frequency fc1 of the SCF 40 is variably set. Therefore, the filter characteristics of the entire system can be variably set corresponding to the input signal VI that varies in frequency band. The cut-off frequency fc of the SCF 40 is variably set by changing the capacitance ratio of a plurality of capacitors (described later) (ice., has no size dependence). Therefore, the resistor and the capacitor can be easily incorporated in the integrated circuit device as compared with the method that sets the cut-off frequency using only the continuous-time filter 30 (RC filter).

3. Second Specific Example

Figure 5:
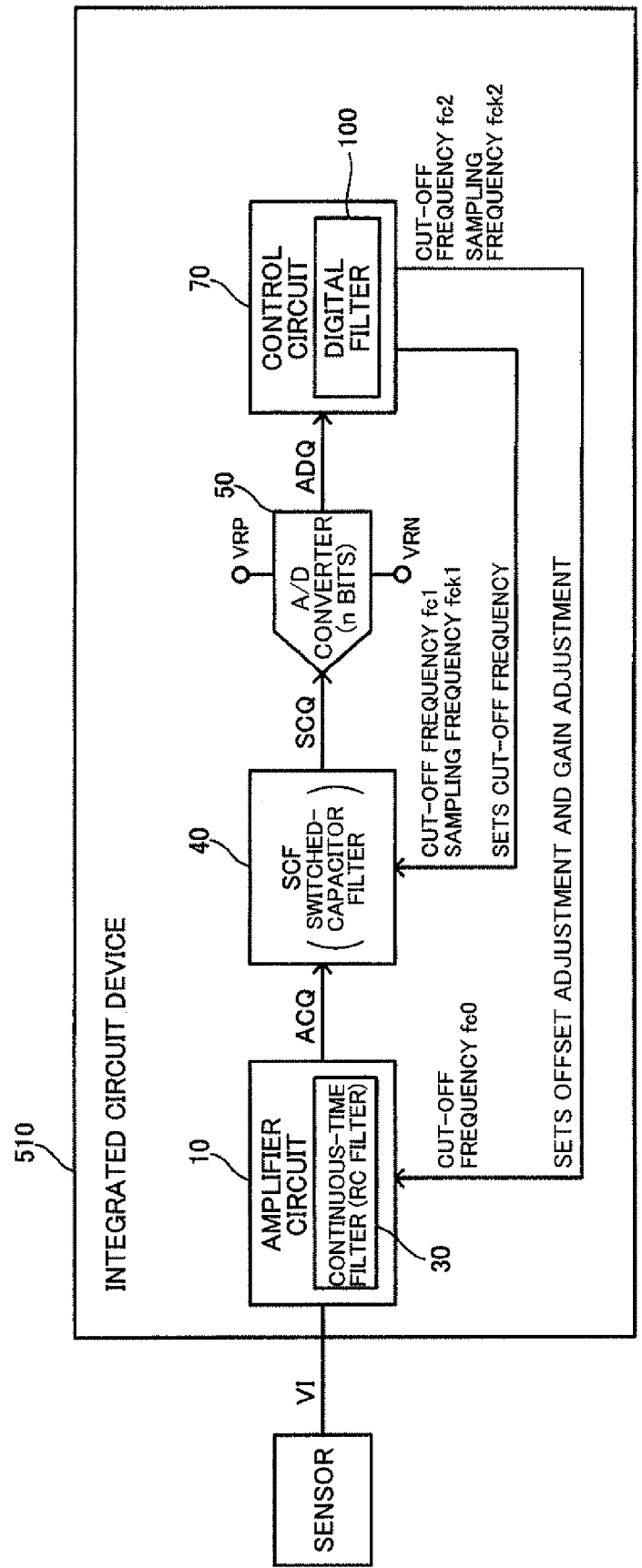
FIG. 5 shows a second specific example of an integrated circuit device according to one embodiment of the invention.

FIG. 5 shows a second specific example of the integrated circuit device according to this embodiment. In the second specific example, a digital filter 100 is implemented by the control circuit 70. Note that various modifications may be made, such as providing the SCF40 without providing the digital filter 100, or providing the digital filter 100 without providing the SCF40.

The digital filter 100 receives the digital data ADQ from the A/D converter 50, performs a digital filter process (e.g., LPF process) on the digital data ADQ, and outputs digital data obtained by the digital filter process. The digital filter 100 performs a digital filter process utilizing the continuous-time filter 30 of the amplifier circuit 10 and the SCF 40 as prefilters, for example. As the digital filter 100, an infinite impulse response (IIR) filter or a finite impulse response (FIR) filter may be used.

The cut-off frequency of the digital filter 100 (second discrete-time filter) is variably set corresponding to the frequency band (passband) of the input signal VI, for example. For example, the cut-off frequency of the digital filter 100 decreases as the frequency band of the input signal VI decreases. The sampling frequency of the digital filter 100 is also variably set.

Specifically, when the cut-off frequency of the continuous-time filter 30 is referred to as fc0, the cut-off frequency of the SCF 40 is referred to as fc1, and the cut-off frequency of the digital filter 100 is referred to as fc2, the relationship "fc0>fc1>fc2" is satisfied, for example. When the sampling frequency of digital filter 100 is referred to as fck2 and the resultant attenuation factor continuous-time filter 30 and the SCF 40 at the frequency fck2−fc2 is AT2 dB, the relationship "AT2≦20×log(1/2")" is satisfied, for example. The sampling frequency fck2 of the digital filter 100 is set to decrease as the cut-off frequency fc1 of the SCF 40 decreases, and the cut-off frequency fc2 of the digital filter 100 is set to decrease as the frequency band of the input signal VI decreases.

In the second specific example shown in FIG. 5, the cut-off frequency fc1 of the SCF 40 (filter 38) and the cut-off frequency fc2 of the digital filter 100 are variably set corresponding to the frequency band of the input signal VI. Therefore, the cut-off frequency can be variably set in the range between 1 Hz and 16 KHz, for example. This makes it possible to deal with the input signal VI that varies in frequency band.

In FIG. 5, the continuous-time filter 30 of the amplifier circuit 10 functions as a prefilter for the SCF 40, and the continuous-time filter 30 and the SCF 40 function as prefilters for the digital filter 100 (and the A/D converter 50). This implements a variable band in a wide range from 1 Hz to 16 KHz, for example.

As a comparative example, only the continuous-time filter may be provided as a prefilter for the digital filter without providing the SCF. According to this comparative example, when using an RC filter as the continuous-time filter, the cut-off frequency is determined by the reciprocal of the RC product (i.e., product of resistance and capacitance). Therefore, it is necessary to increase the resistance and the capacitance in order to deal with various frequency bands. This makes it difficult to incorporate the resistor and the capacitor in an integrated circuit device. As a result, the resistor and the capacitor must be provided externally.

In FIG. 5, the filter 38 is provided between the amplifier circuit 10 (i.e., continuous-time filter 30) and the A/D converter 50. Moreover, the cut-off frequency fc1 of the SCF 40 and the cut-off frequency fc2 of the digital filter 100 are variably set. Therefore, the filter characteristics of the entire system can be variably set corresponding to the input signal VI that varies in frequency band.

4. Third Specific Example

Figure 6:
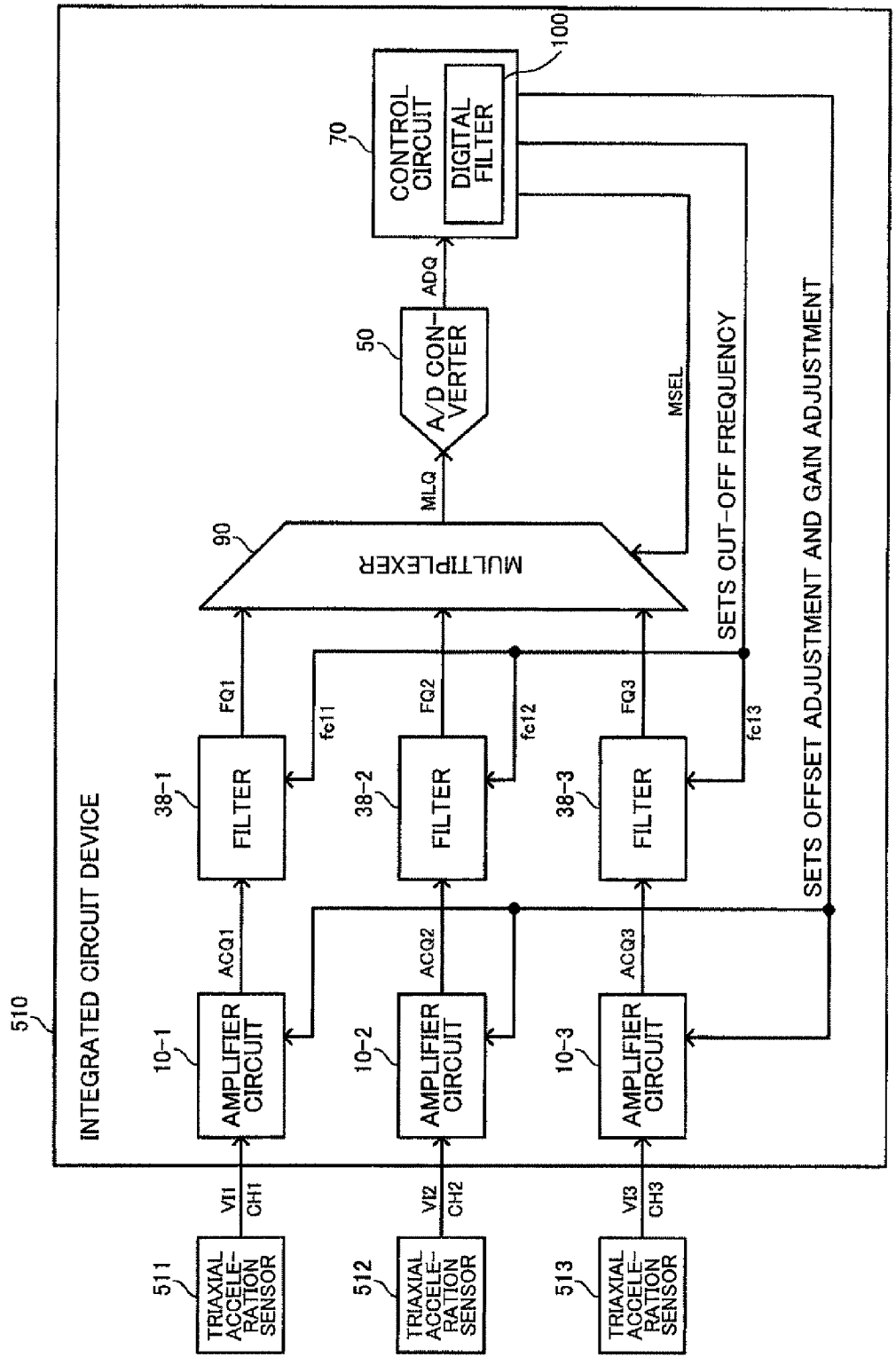
FIG. 6 shows a third specific example of an integrated circuit device according to one embodiment of the invention.

FIG. 6 shows a third specific example of the integrated circuit device according to this embodiment. In FIG. 6, the integrated circuit device has a plurality of input channels CH1 to CH3. In FIG. 1, one amplifier circuit 10 and one filter 38 are provided. In FIG. 6, a plurality of amplifier circuits 10-1 to 10-3 (first to Mth amplifier circuits in a broad sense; M is an integer equal to or larger than two) and a plurality of filters 38-1 to 38-3 (first to Mth filters in a broad sense) are provided. A multiplexer 90 (selector) is provided in the subsequent stage of the filters 38-1 to 38-3.

Although FIG. 6 shows a three-channel configuration example, a two-channel configuration or a four or more channel configuration may also be employed. As the filters 38-1 to 38-3, an SCF or the like may be used in the same manner as in FIG. 5. The digital filter 100 may be implemented by the control circuit 70, and the amplifier circuits 10-1 to 10-3 may be used as continuous-time filters in the same manner as in FIG. 5.

Input signals VI1 to VI3 (first to third input signals in a broad sense) are respectively input to the amplifier circuits 10-1 to 10-3 (first to Mth amplifier circuits). An offset adjustment corresponding to the DC offsets of the input signals VI1 to VI3 and a gain adjustment corresponding to the amplitudes of the input signals VI1 to VI3 are performed. The control circuit 70 sets the offset adjustment and the gain adjustment.

The cut-off frequencies fc11 to fc13 of the filters 38-1 to 38-3 are variably set corresponding to the frequency bands of the input signals VI1 to VI3. The control circuit 70 sets the cut-off frequencies fc11 to fc13.

The multiplexer 90 selects one of the output signals from the filters 38-1 to 38-3, and outputs the selected output signal to the A/D converter 50 as a multiplexer output signal MLQ. Specifically, the multiplexer 90 selects an output signal indicated by a selection instruction signal MSEL from the control circuit 70 from the output signals from the filters 38-1 to 38-3, and outputs the selected output signal. The A/D converter 50 performs an A/D conversion process on the multiplexer output signal MLQ.

In FIG. 6, detection signals from triaxial acceleration sensors 511, 512, and 513 are input to the channels CR1, CR2, and CR3 as the input signals VI1, VI2, and VI3. The amplifier circuits 10-1 to 10-3 amplify the input signals VI1 to VI3 in the channels CH1 to CH3, and the filters 38-1 to 38-3 filter the amplified signals.

According to this configuration, the multiplexer 90 can output filter output signals FQ1 to FQ3 corresponding to the detection signals from the triaxial acceleration sensors 511 and 512 to the A/D converter 50 by time division, and the A/D converter 50 can perform an A/D conversion process on the filter output signals output by time division. This makes it possible to subject the detection signals from a plurality of sensors to A/D conversion using a single integrated circuit device so that convenience to the user can be improved. Moreover, since the detection signals from a plurality of sensors can be integrally subjected to A/D conversion and digital processing, the processing efficiency can be improved.

According to the third specific example shown in FIG. 6, an offset adjustment, a gain adjustment, and a cut-off frequency can be independently set corresponding to each channel. Specifically, the settings of an offset adjustment, a gain adjustment, and a cut-off frequency corresponding to the channel CH1 may be caused to differ from the settings of an offset adjustment, a gain adjustment, and a cut-off frequency corresponding to the channels CR2 and CH3, for example.

Figure 7:
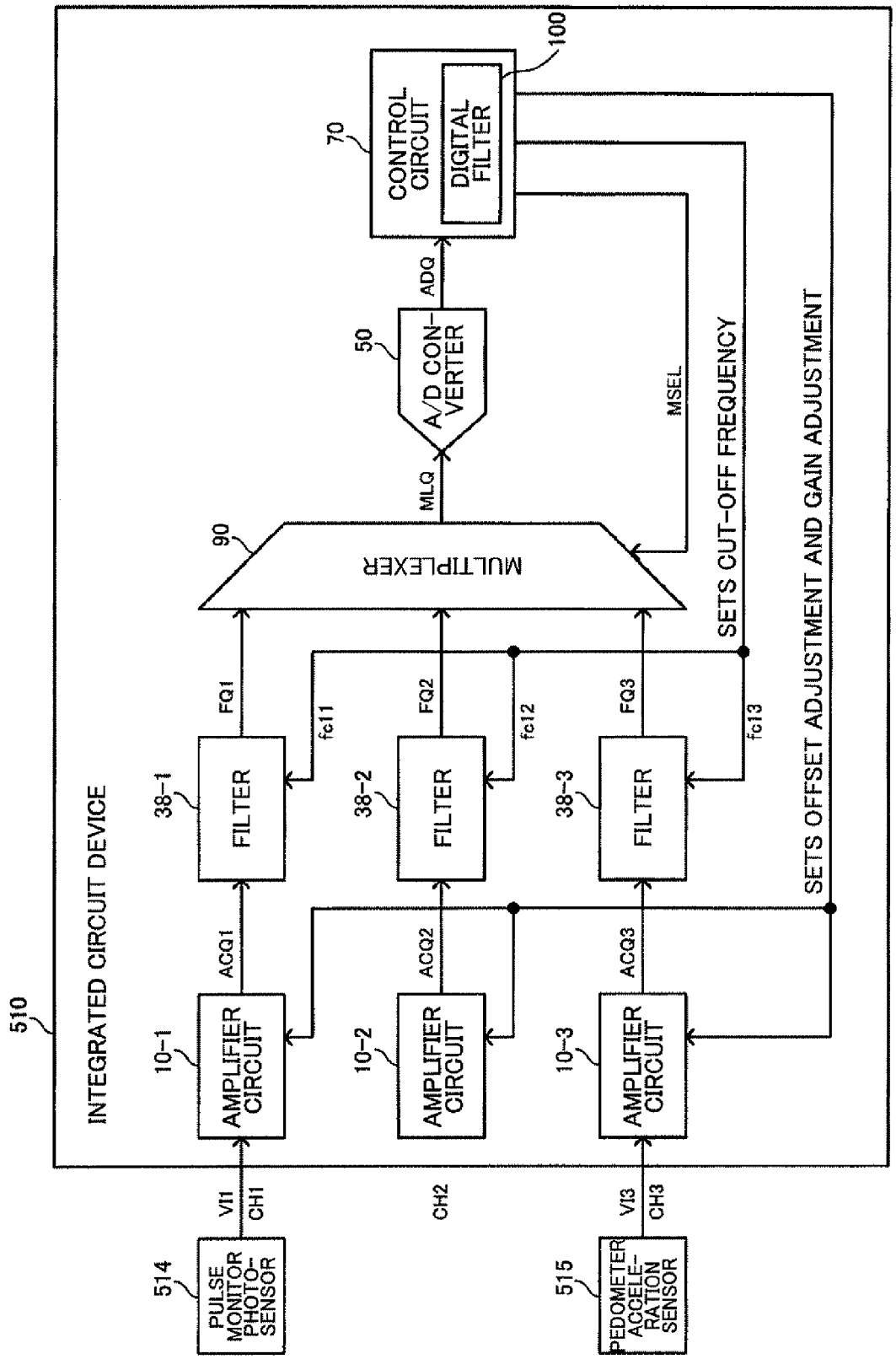
FIG. 7 shows a third specific example of an integrated circuit device according to one embodiment of the invention.

In FIG. 7, a pulse monitor photosensor 514 is connected to the channel CH1, and a pedometer acceleration sensor 515 is connected to the channel CH2, for example. In this embodiment the amplifier circuit 10-1 and the filter 38-1 set an offset adjustment, a gain adjustment, and a cut-off frequency under first setting conditions with regard to the input signal VI1 from the photosensor 514 connected to the channel CH1 under control of the control circuit 70. The amplifier circuit 10-3 and the filter 38-3 set an offset adjustment, a gain adjustment, and a cut-off frequency under second setting conditions with regard to the input signal VI1 from the photosensor 514 connected to the channel CH2 under control of the control circuit 70.

Specifically, the DC offset, the amplitude, and the frequency band of the input signal VI1 from the photosensor 514 differ from the DC offset, the amplitude, and the frequency band of the input signal VI3 from the acceleration sensor 515. Therefore, a first integrated circuit device (IC) for the photosensor 514 and a second integrated circuit device for the acceleration sensor 515 are generally provided separately and mounted on a circuit board of an electronic instrument. As a result, the system configuration of the electronic instrument becomes complicated, and the size of the electronic instrument increases, for example.

On the other hand, the third specific example of this embodiment makes it possible to process the input signals VI1 and VI3 from the photosensor 514 and the acceleration sensor 515 using a single (one-chip) integrated circuit device. Therefore, the system configuration of the electronic instrument can be simplified, and the size of the electronic instrument can be reduced. According to the example shown in FIG. 7, a health-care electronic instrument having a pulse monitor function and a pedometer function in which the detection signals from the sensors can be processed using a single (one-chip) integrated circuit device can be provided, for example.

According to this embodiment, an offset adjustment, a gain adjustment, a cut-off frequency are automatically set corresponding to the DC offset, the amplitude, and the frequency band of the input signal VI1, and an offset adjustment, a gain adjustment, a cut-off frequency are automatically set corresponding to the DC offset, the amplitude, and the frequency band of the input signal VI2. Therefore, when the user has connected the desired sensors to the integrated circuit device, an offset adjustment, a gain adjustment, and a cut-off frequency are automatically set by the integrated circuit device corresponding to each sensor so that the user can obtain A/D-converted data. This improves convenience to the user.

In the development/trial production stage of a new sensor, for example, the DC offset, the amplitude, and the frequency band of the detection signal from the sensor may be unknown. According to this embodiment, the user can connect a plurality of sensors to the integrated circuit device without taking much account of the DC offset, the amplitude, and the frequency band of the detection signal. Therefore, an integrated circuit device (sensor measurement assistance IC) convenient to the user can be provided. Moreover, since trial production and the like are facilitated, the product development cost can be reduced, for example.

5. Frequency Characteristics

The details of the frequency characteristics of the variable filter implemented by the integrated circuit device according to this embodiment are described below. Note that the continuous-time filter 30 shown in FIGS. 4, 5, and the like is hereinafter referred to as an RC filter 30 for convenience.

Figure 8:
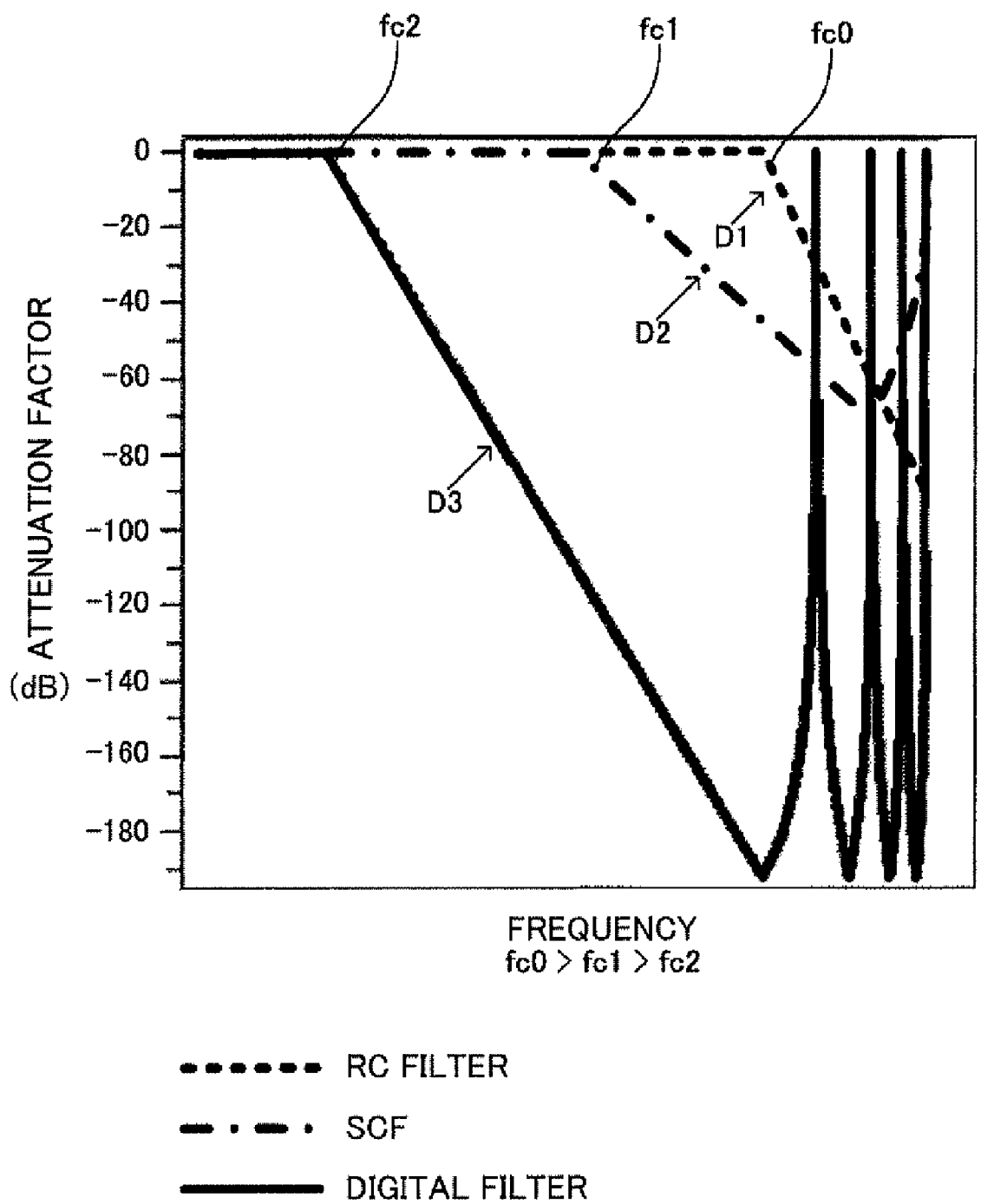
FIG. 8 shows an example of the frequency characteristics of each filter when the frequency axis is a LOG axis.

D1, D2, and D3 shown in FIG. 8 indicate examples of the frequency characteristics of the attenuation factors of the RC filter 30, the SCF 40, and the digital filter 1on, respectively. When the cut-off frequency of the RC filter 30 (D1) is fc0, the cut-off frequency of the SCF 40 (D2) is fc1, and the cut-off frequency of the digital filter 100 (D3) is fc2, the relationship "fc0>fc1>fc2" is satisfied, for example. The variable filter function of the integrated circuit device that deals with an input signal that varies in frequency band can be implemented by a small circuit configuration by satisfying the above-mentioned cut-off frequency relationship.

Figure 9:
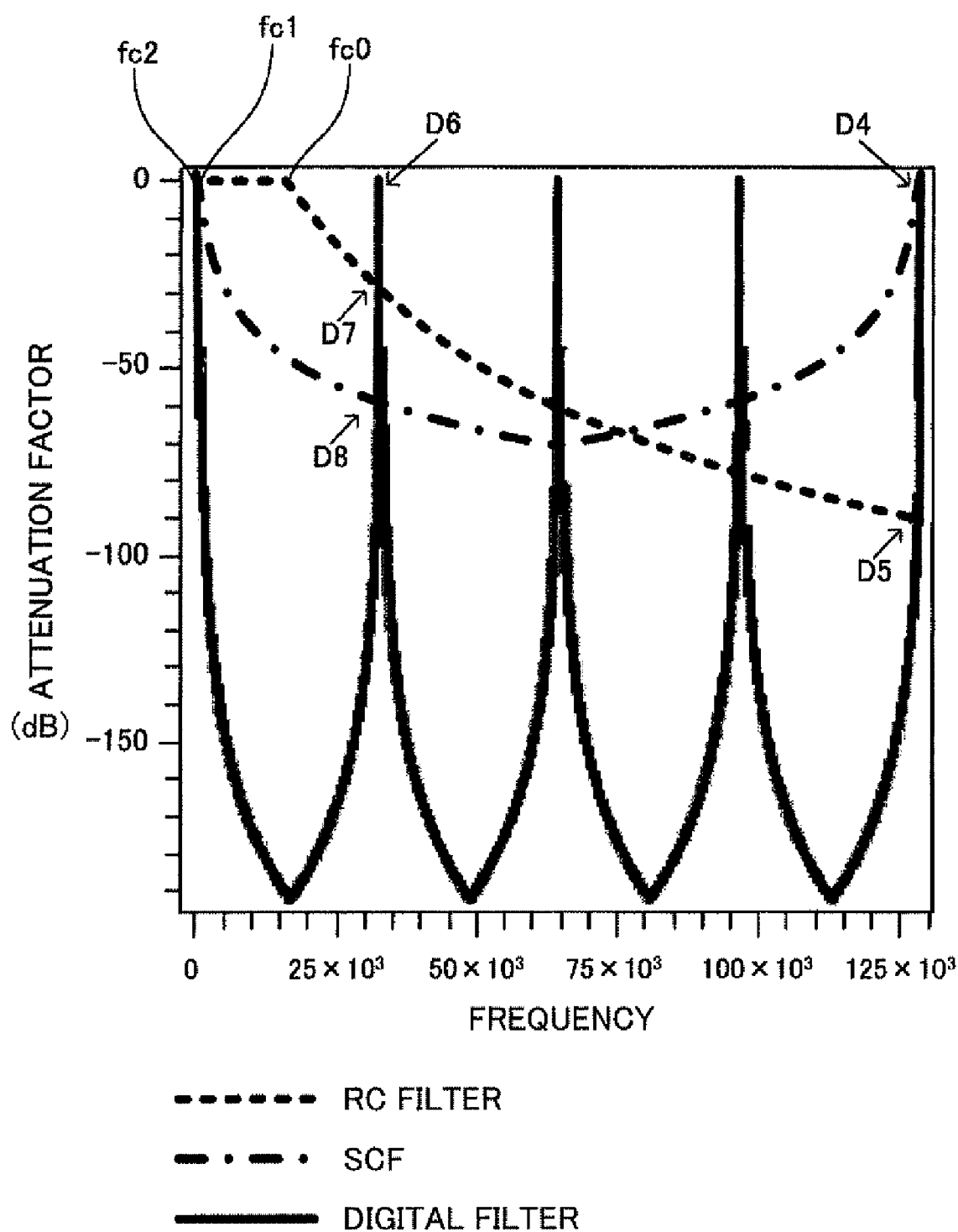
FIG. 9 shows an example of the frequency characteristics of each filter when the frequency axis is a linear axis.

In FIG. 8, the frequency axis is indicated by a LOG axis, for example. In FIG. 9, the frequency axis is indicated by a linear axis.

Since the SCF 40 is a discrete-time filter, a harmonic signal passes through the SCF 40 near the sampling frequency fck1 of the SCF 40 due to anti-aliasing (see D4 in FIG, 9) so that a folding noise occurs.

According to this embodiment the RC filter 30 functions as a prefilter for the SCF 40. Therefore, a harmonic signal that causes a folding noise can be attenuated to a voltage equal to or lower than the 1LSB-equivalent voltage of the A/D converter 50 (equal to or less than a quantization error) due to the attenuation characteristics of the RC filter 30 (see D5 in FIG. 9), for example.

Since the digital filter 100 is a discrete-time filter, a harmonic signal passes through the digital filter 100 near the sampling frequency fck2 (folding band) of the digital filter 100 due to anti-aliasing (see D6 in FIG. 9) so that a folding noise occurs.

According to this embodiment, the RC filter 30 and the SCF 40 function as prefilters for the digital filter 100. Therefore, a harmonic signal that causes a folding noise can be attenuated to a voltage equal to or lower than the 1LSB-equivalent voltage of the A/D converter 50 due to the resultant attenuation characteristics of the RC filter 30 and the SCF (see D7 and D8 in FIG. 9), for example.

Figure 10:
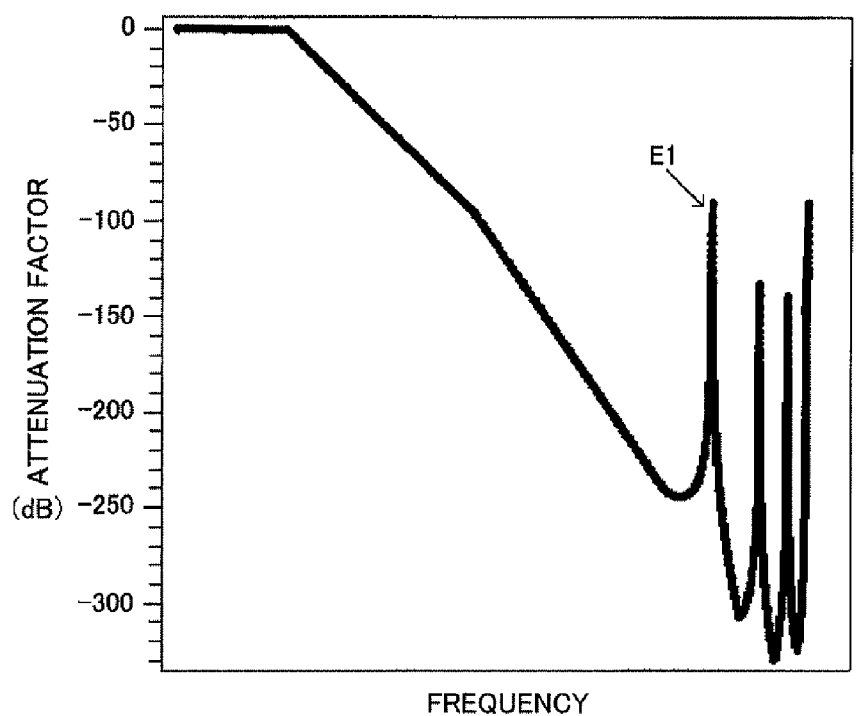
FIG. 10 shows an example of the frequency characteristics of the entire system when the frequency axis is a LOG axis.

FIG. 10 shows the frequency characteristics of the filter attenuation factor of the entire system of the integrated circuit device. When the number of bits of the resolution of the A/D converter 50 is n, an attenuation factor AT required to attenuate a harmonic signal to a voltage equal to or lower than the 1LSB-equivalent voltage of the A/D converter 50 is expressed by $AT=20\times\log(1/2^n)$. Therefore, when n=10 bits, the attenuation factor AT is about −60 dB.

Figure 11:
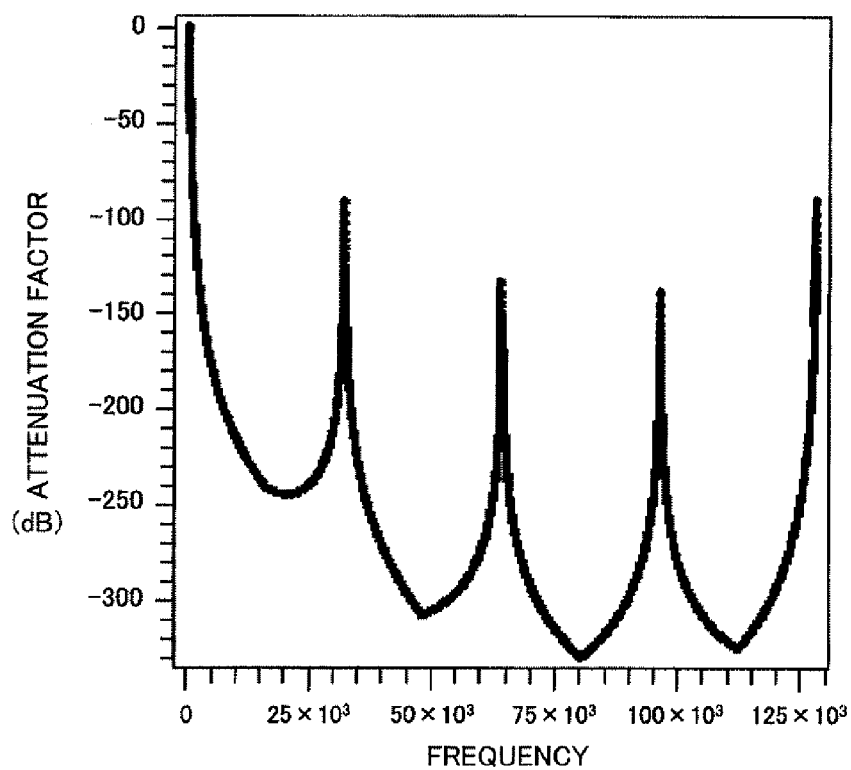
FIG. 11 shows an example of the frequency characteristics of the entire system when the frequency axis is a linear axis.

The attenuation factor of the filter at E1 in FIG. 10 is −60 dB or less (i.e., a harmonic signal is attenuated to a voltage equal to or lower than the 1LSB-equivalent voltage of the A/D converter 50). In FIG. 10, the frequency axis is indicated by a LOG axis. In FIG. 11, the frequency axis is indicated by a linear axis.

According to this embodiment, a folding noise due to the discrete-time filter can be removed by the prefilter. Therefore, a variable filter that can deal with an input signal that varies in frequency band can be implemented by a small circuit scale by variably changing the cut-off frequency fc2 of the digital filter 100 corresponding to the frequency of the input signal.

For example, it suffices that the RC filter 30 remove a folding noise due to the SCF 40 (see D5 in FIG. 9). Therefore, the cut-off frequency fc0 of the RC filter 30 can be set at a high frequency (see D1 in FIG. 8). Specifically, the cut-off frequency fc0 of the RC filter 30 can be set to be sufficiently higher than the cut-off frequencies fc1 and fc2 of the SCF 40 and the digital filter 100 (fc0>fc1>fc2). The cut-off frequency fc0 is proportional to the reciprocal of the RC product. Therefore, since the cut-off frequency fc0 of the RC filter 30 can be set at a high frequency, the resistance and the capacitance of the RC filter 30 can be reduced. According to this embodiment, since the layout area of the resistor and the capacitor can be reduced due to a reduction in resistance and capacitance, the circuit scale can be reduced. Moreover, since the resistor and the capacitor need not be provided externally, convenience to the user can be improved.

According to this embodiment, since the SCF 40 is provided between the RC filter 30 and the digital filter 100, a folding noise due to the digital filter 100 can be removed by the SCF 40 (see D8 in FIG. 9). The RC filter 30 also contributes to removal of a folding noise due to the digital filter 100 (see D7). This makes it possible to set the sampling frequency fck2 of the digital filter 100 at a low frequency. Specifically, when the sampling frequency fck2 decreases, the folding band near the sampling frequency fck2 (D6) is shifted to a low frequency side. In this case, a folding noise can be sufficiently attenuated and removed due to the attenuation characteristics of the SCF 40 (see D8).

Since the sampling frequency fck2 of the digital filter 100 can be reduced, the cut-off frequency fc2 of the digital filter 100 can be set at a low frequency (see D3 in FIG. 8). Specifically, the cut-off frequency fc2 of the digital filter 100 can be set to be sufficiently lower than the cut-off frequencies fc0 and fc1 of the RC filter 30 and the SCF 40 (fc0>fc1>fc2).

Since the cut-off frequency fc2 of the digital filter 100 can be reduced, the cut-off frequency fc2 can be set corresponding to the frequency band of the input signal.

For example, when the frequency band of the input signal is low (e.g., 0 to 1 Hz), it is possible to deal with the input signal in such a low frequency band by setting the cut-off frequency fc2 of the digital filter 100 at 1 Hz, for example.

When the frequency band of the input signal is 0 to 256 Hz, it is possible to deal with the input signal by setting the cut-off frequency fc2 of the digital filter 100 at 256 Hz, for example.

When the frequency band of the input signal is high (e.g., 0 to 16 KHz), the input signal is filtered using only the RC filter 30 of which the cut-off frequency fc0 is 16 KHz while disabling the filter processes of the digital filter 100 and the SCF 40.

6. Attenuation Factor

The details of the filter attenuation factor setting method are described below with reference to FIG. 12. At F1 in FIG. 12, fck1 and fc1 respectively indicate the sampling frequency and the cut-off frequency of the SCF 40, and n indicates the number of bits that indicates the resolution of the A/D converter 50. AT1 (dB) indicates the attenuation factor of the RC filter 30 (continuous-time filter) at a frequency fck1−fc1. In this case, the relationship "$AT1 \leq 20 \times \log(1/2^n)$", is satisfied.

Figure 13A:
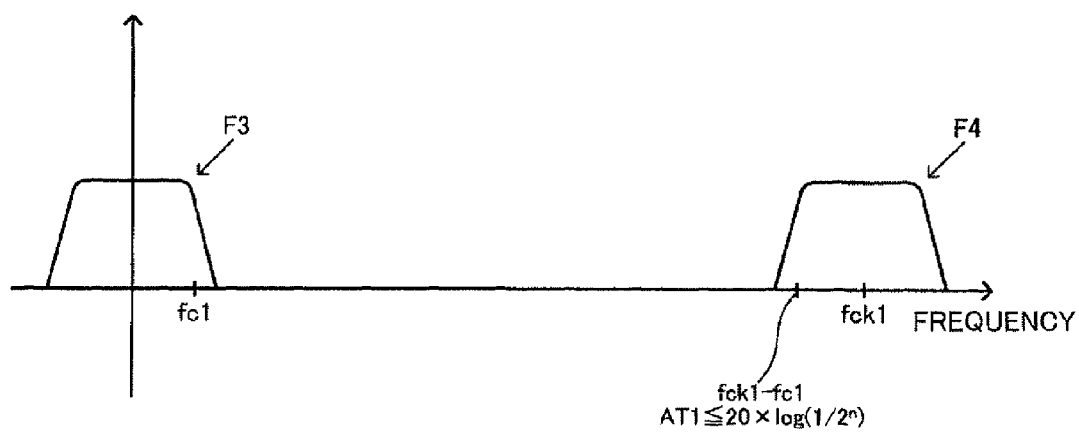
FIGS. 13A and 13B are views illustrative of an attenuation factor setting method.

Specifically, when the sampling frequency of the SCF 40 is fck1, a harmonic signal in a band fck1−fc1 to fck1+fc1 (see F4 in FIG. 13A) folds into a band 0 to fc1 (see F3) due to anti-aliasing. Therefore, in order to maintain the resolution corresponding to the 1LSB of the A/D converter 50, it is necessary to attenuate the harmonic signal by $20 \times \log(1/2^n)$ at least at a frequency fck1−fc1. Therefore, the attenuation factor AT1 of the RC filter 30 that functions as a prefilter for the SCF 40 is expressed by $AT1 \leq 20 \times \log(1/2^n)$ at a frequency fck1−fc1. For example, when n=10, the attenuation factor AT1 is equal to or smaller than −60 dB (AT1≦−60 dB).

Figure 12:
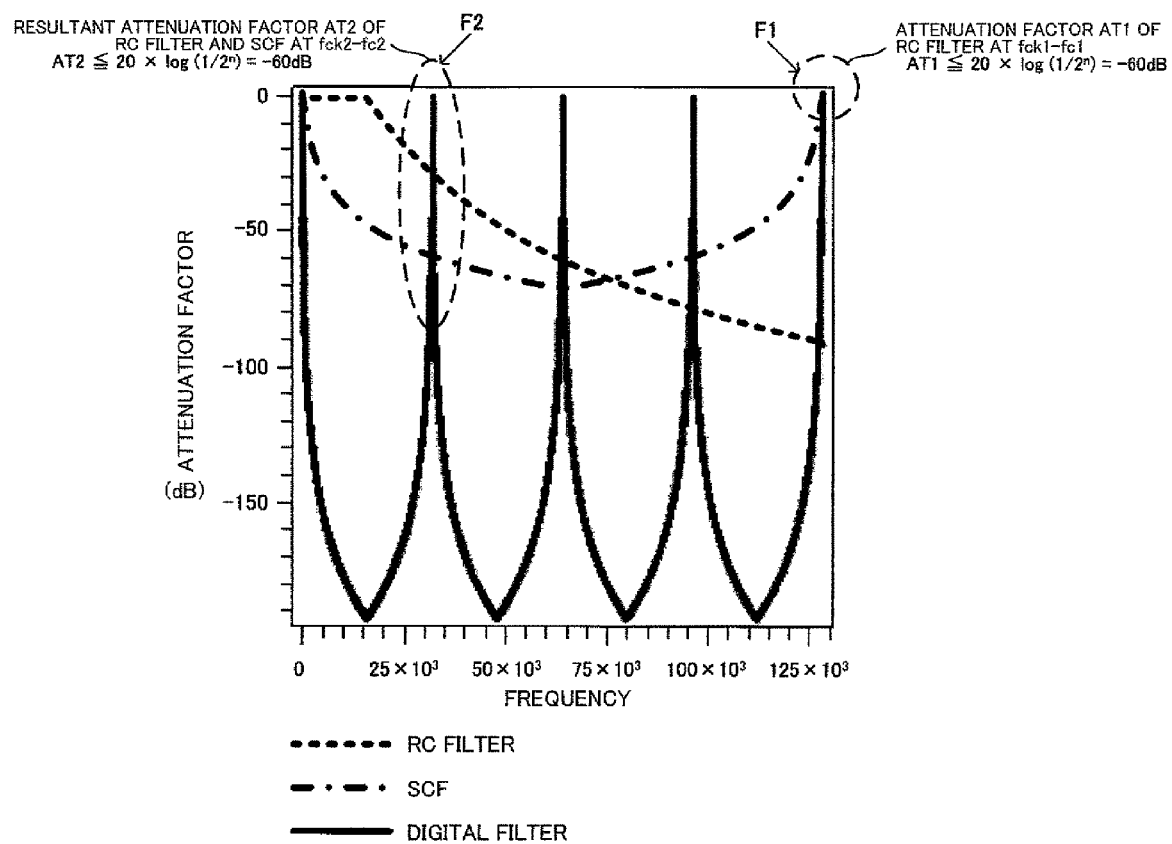
FIG. 12 is a view illustrative of an attenuation factor setting method.

At F2 in FIG. 12, fck2 and fc2 respectively indicate the sampling frequency and the cut-off frequency of the digital filter 100, and n indicates the number of bits that indicates the resolution of the A/D converter 50. AT2 (dB) indicates the resultant attenuation factor of the RC filter 30 and the SCF 40 at a frequency fck2−fc2. In this case, the relationship "$AT2 \leq 20 \times \log(1/2^n)$)" is satisfied.

Figure 13B:
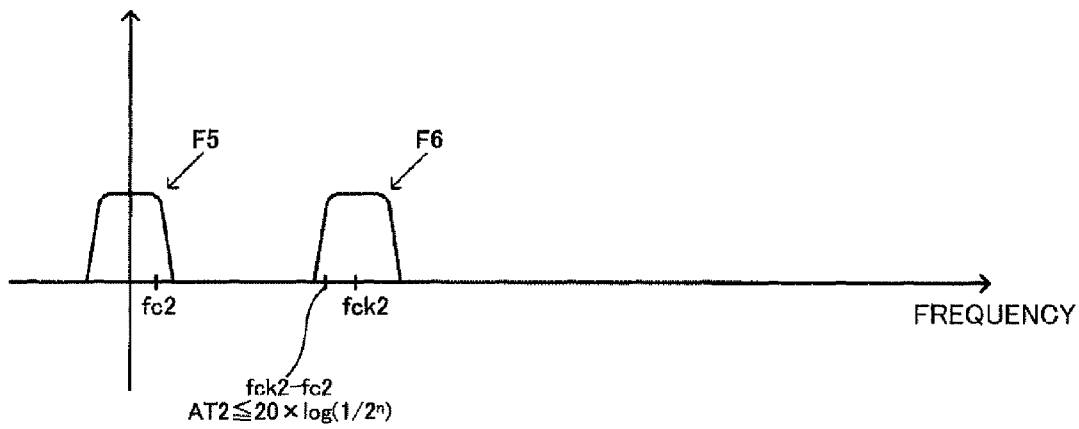

Specifically, when the sampling frequency of the digital filter 100 is fck2, a harmonic signal in a band fck2−fc2 to fck2+fc2 (see F6 in FIG. 13B) folds into a band 0 to fc2 (see F5) due to anti-aliasing. Therefore, in order to maintain the resolution corresponding to the 1LSB of the A/D converter 50, it is necessary to attenuate the harmonic signal by $20 \times \log(1/2^n)$ at least at a frequency fck2−fc2. Therefore, the resultant attenuation factor AT2 of the SCF 40 and the RC filter 30 that function as prefilters for the digital filter 100 is expressed by $AT2 \leq 20 \times \log(1/2^n)$ at a frequency fck2−fc2. For example, when n=10, the attenuation factor AT2 is equal to or smaller than −60 dB (AT2≦−60 dB).

If the relationships indicated by F1 and F2 in FIG. 12 are satisfied, a harmonic signal can be appropriately attenuated (see E1 in FIG. 10). This effectively prevents a situation in which the resolution corresponding to the 1LSB of the A/D converter 50 can not be maintained due to a folding noise.

7. Frequency Setting

The details of the cut-off frequency/sampling frequency setting method according to this embodiment is described below. FIG. 14 shows a frequency setting example.

As indicated by G1 in FIG. 14, the cut-off frequency fc0 of the RC filter 30 is fixed at f0. The frequency F0 is a frequency in the range from 10 KHz to 20 KHz, for example. It is unnecessary to externally provide a resistor and a capacitor by fixing the cut-off frequency fc0 at f0 so that convenience to the user can be improved. Note that a modification in which the cut-off frequency fc0 is variably set is also possible.

As indicated by G2 and G4 in FIG. 14, the cut-off frequency fc1 of the SCF 40 and the cut-off frequency fc2 of the digital filter 100 are variably set. Specifically, the cut-off frequency fc1 is variably set in the range from f11 to f15, for example. The frequency f11 is a frequency in the range from 10 Hz to 100 Hz, for example. The frequencies f14 and f15 are the same as the frequency of the input signal. For example, f14=4 KHz and f15=8 KHz.

The cut-off frequency fc2 of the digital filter 100 is variably set in the range from 1 Hz to 1024 Hz, for example. Specifically, the cut-off frequency fc2 is set to coincide with the frequency band of the input signal. For example, when the frequency band of the input signal is 1 Hz (0 to 1 Hz), the cut-off frequency fc2 is set at 1 Hz. When the frequency band of the input signal is 2 Hz (0 to 2 Hz), the cut-off frequency fc2 is set at 2 Hz.

When the frequency band of the input signal is 4 KHz or 8 KHz, the filter process of the digital filter 100 is disabled, and the cut-off frequency fc1 of the SCF 40 is set at 4 KHz or 8 KHz. When the frequency band of the input signal is 16 KHz, the filter processes of the digital filter 100 and the SCF 40 are disabled, and the cut-off frequency of the entire system is set by the cut-off frequency fc0 (=f0) of the RC filter 30.

As indicated by G2 and G3 in FIG. 14, the sampling frequency fck1 of the SCF 40 is fixed at fs1, and the cut-off frequency fc1 of the SCF 40 is variably set.

Specifically, when the sampling frequency fck1 of the SCF 40 changes, the frequency in the folding band of the SCF 40 (D4 in FIG. 9) changes. This makes it difficult to design the filter frequency characteristics. Therefore, the sampling frequency fck1 is fixed at fs1 (G3 in FIG. 14). The frequency fs1 is a frequency in the range from 50 KHz to 200 KHz, for example. The frequency fs1 is the same as the sampling frequency fck2 (=fs24) of the digital filter 100, for example. Note that a modification in which the sampling frequency fck1 is variably set is also possible.

On the other hand, the cut-off frequency fc1 of the SCF 40 is variably set (G2 in FIG. 14). Specifically, the cut-off frequency fc1 is variably set by changing the capacitance ratio of a plurality of capacitors included in the SCF 40. The cut-off frequency fc1 of the SCF 40 may be set based on the sampling frequency fck2. In this case, it is it difficult to design the filter frequency characteristics. Therefore, the sampling frequency fck1 is fixed at fs1, and the cut-off frequency fc1 is variably set by changing the capacitance ratio of the capacitors of the SCF 40 (G2 and G3 in FIG. 14).

Since the capacitance ratio of the capacitors has no size dependence, the layout area of the capacitors does not increase to a large extent even if the cut-off frequency fc1 is made variable. Therefore, the cut-off frequency can be variably set while suppressing an increase in circuit scale.

As indicated by G4 and G5 in FIG. 14, the sampling frequency fck2 and the cut-off frequency fc2 of the digital filter 100 are variably set.

Specifically, the sampling frequency fck2 of the digital filter 100 is variably set so that the sampling frequency fck2 decreases as the cut-off frequency fc1 of the SCF 40 decreases (see G2 and G5). For example, when the cut-off frequency fc1 of the SCF 40 is f11, the sampling frequency fck2 of the digital filter 100 is set at fs21. When the cut-off frequency fc1 of the SCF 40 is f12, the sampling frequency fck2 of the digital filter 100 is set at fs22. When the cut-off frequency fc1 of the SCF 40 is f13, the sampling frequency fck2 of the digital filter 100 is set at fs23 or fs24. Note that the relationship f11<f12<f13<f14<f15 and the relationship fs21<fs22<fs23<fs24 are satisfied.

As indicated by (14 in FIG. 14, the cut-off frequency fc2 of the digital filter 100 is set so that the cut-off frequency fc2 decreases as the frequency band of the input signal decreases. Specifically, when the frequency band of the input signal is 1, 2, 4, 8, 16, 32, 64, 128, 256, 512, or 1024 Hz, the cut-off frequency fc2 is also set at 1, 2, 4, 8, 16, 32, 64, 128, 256, 512, or 1024 Hz.

As shown in FIG. 15, the digital filter 100 is configured so that a given number (e.g., five) of cut-off frequencies fc2 can be set corresponding to one sampling frequency fck2, for example. In FIG. 15, the cut-off frequency fc2 can be set at 1, 2, 4, 8, and 16 Hz when the sampling frequency fck2 is fs21, and the cut-off frequency fc2 can be set at 4, 8, 16, 32, and 64 Hz when the sampling frequency fck2 is fs22. This also applies to the case where the sampling frequency fck2 is fs23 or fs24.

In FIG. 14, 1, 2, 4, 8, and 16 Hz are selected as the cut-off frequency fc2 when the sampling frequency fck2 is fs21, 32 and 64 Hz are selected as the cut-off frequency fc2 when the sampling frequency fck2 is fs22, 128 and 256 Hz are selected as the cut-off frequency fc2 when the sampling frequency fck2 is fs23, and 512 and 1024 Hz are selected as the cut-off frequency fc2 when the sampling frequency fck2 is fs24 (encircled in FIG. 15). Therefore, the cut-off frequency fc2 of the digital filter 100 can be set at a frequency corresponding to the frequency band of the input signal using the digital filter 100 having a simple and small configuration.

According to this embodiment, since the SCF 40 is used as a prefilter for the digital filter 100, a folding noise due to the digital filter 100 can be sufficiently attenuated by the SCF 40 (see D8 in FIG. 9). Therefore, the sampling frequency fck2 corresponding to the frequency in the folding band (D6) can be shifted to a low frequency side. This makes it possible to reduce the sampling frequency fck2 of the digital filter 100 so that the digital filter 100 can be operated at a low frequency.

The order of the digital filter 100 can be reduced as the frequency difference between the sampling frequency fck2 and the cut-off frequency fc2 decreases. Since the sampling frequency fck2 can be reduced, the circuit scale of the digital filter 100 can be reduced by reducing the order of the digital filter 100. Since the cut-off frequency fc2 can be reduced by reducing the sampling frequency fck2, it is possible to deal with an input signal in a frequency band as low as 1 Hz. Specifically, the cut-off frequency fc2 of the digital filter 100 can be set to deal with a low frequency band of the input signal. This makes it possible to deal with an input signal in a wide range from 1 Hz to 16 KHz, for example. As a result, an integrated circuit device that can be connected to various sensors can be provided.

8. Intermittent Operation Of A/D Converter

In this embodiment, the sampling frequency fck1' of the A/D converter 50 is set to be the same as the sampling frequency fck1 of the SCF 40, for example. Since the sampling frequency fck2 of the digital filter 100 can be reduced, as described above, the sampling frequency fck2 can be variably set in such a range that the relationship fck1'≧fck2 is satisfied. Therefore, the A/D converter 50 can perform an intermittent operation (thinning-out operation) in which the A/D converter 50 performs the A/D conversion operation at a timing indicated by H1 in FIG. 16, does not perform the A/D conversion operation at timings indicated by H2, H3, and H4, performs the A/D conversion operation at a timing indicated by H5, and does not perform the A/D conversion operation at timings indicated by H6 and H7.

In FIG. 17, the frequency band of the input signal is 1 Hz, and the cut-off frequency fc2 of the digital filter 100 is set at 1 Hz, for example. In this case, the sampling frequency fck1' of the A/D converter 50 is set at fck1=fs1=128 KHz, for example. On the other hand, the sampling frequency fck2 of the digital filter 100 is set at fs21=2 KHz that is sufficiently lower than fck1=128 KHz. Therefore, when fck1>fck2 (i.e., fck1'>fck2), the A/D converter 50 intermittently performs the A/D conversion operation every (fck1'/fck2)=(fck1/fck2)=(128/2)=64 timings. Specifically, the A/D converter 50 performs the A/D conversion operation in a cycle of 1/64th of that of the digital filter 100. The A/D converter 50 outputs digital data obtained the intermittent A/D conversion operations to the digital filter 100.

In FIG. 18, the frequency band of the input signal is 256 Hz, and the cut-off frequency fc2 of the digital filter 100 is set at 256 Hz. The sampling frequency fck1' of the A/D converter 50 is set at fck1=128 KHz, for example. On the other hand, the sampling frequency fck2 of the digital filter 100 is set at fs23=32 KHz. Therefore, the A/D converter 50 intermittently performs the A/D conversion operation every (fck1'/fck2)=(fck1/fck2)=(128/32)=4 timings. Specifically, the A/D converter 50 performs the A/D conversion operation in a cycle of 1/4th of that of the digital filter 100.

In FIG. 19, the frequency band of the input signal is 1024 Hz, and the cut-off frequency fc2 of the digital filter 100 is set at 1024 Hz. The sampling frequency fck1' of the A/D converter 50 is set at fck1=128 KHz, for example. On the other hand, the sampling frequency fck2 of the digital filter 100 is set at fs24=128 KHz. Therefore, since (fck1'/fck2)=(fck1/ fck2)=1, the A/D converter 50 performs a normal operation. Specifically, the A/D converter 50 performs the A/D conversion operation in the same cycle as that of the digital filter 100.

Figure 16:
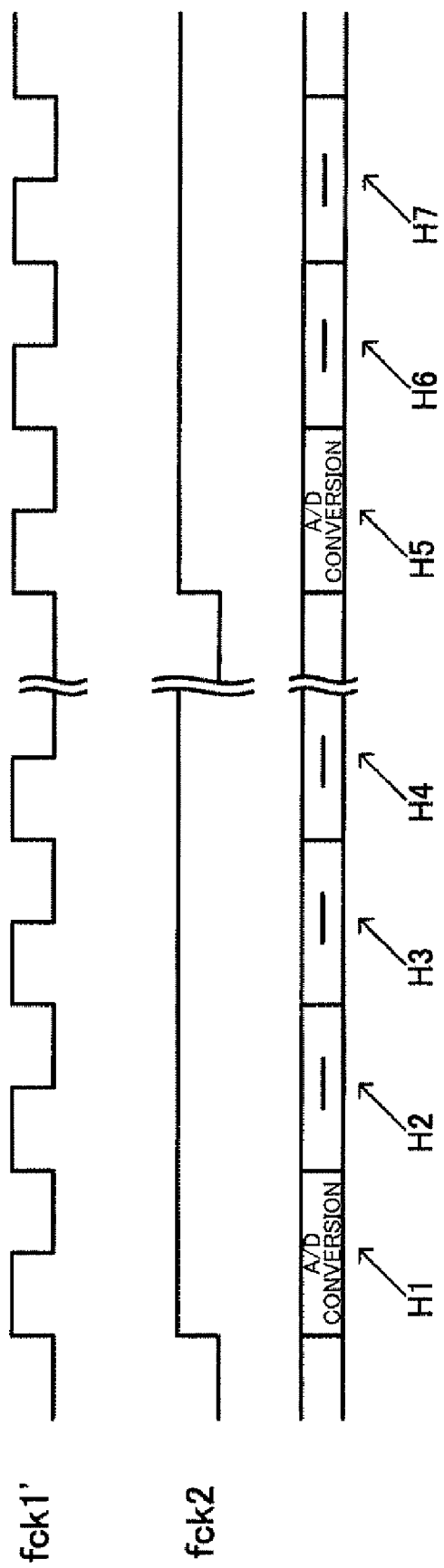
FIG. 16 is a waveform diagram illustrative of an intermittent operation of an A/D converter.

If the A/D converter 50 intermittently operates as shown in FIGS. 16 to 18, the A/D converter 50 can transition to a sleep mode in a period indicated by H2, H3, and H4 after performing the A/D conversion operation at a timing indicated by H1 in FIG. 16. Therefore, a situation in which the A/D converter 50 operates unnecessarily when the frequency band of the input signal is low to unnecessarily consume power can be prevented. Moreover, since the operation speed of the A/D converter 50 can be reduced, the A/D converter 50 can be reduced in scale.

Moreover, when providing a plurality of channels CH1 to CH3 that respectively include an RC filter (continuous-time filter of amplifier circuit) and an SCF, the A/D converter 50 can perform an A/D conversion process on signals from the channels CH1 to CR3 by time division. Specifically, the A/D converter 50 performs an A/D conversion process on a signal from the first channel CH1 at a timing indicated by H1 in FIG. 16, performs an A/D conversion process on a signal from the second channel CH2 at a timing indicated by H2, and performs an A/D conversion process on CH3 a signal from the third channel at a timing indicated by H3, for example. Therefore, a plurality of channels CH1 to CH3 can be subjected to A/D conversion using a single A/D converter 50 so that an integrated circuit device that enables multi-channel A/D conversion can be implemented with a small circuit scale. Note that the sampling frequency fck1' of the A/D converter 50 need not necessarily be the same as the sampling frequency fck1 of the SCF 40. The sampling frequency fck1' of the A/D converter 50 may differ from the sampling frequency fck1 of the SCF 40. For example, the sampling frequency fck1' and the sampling frequency fck1 may have a multiplication relationship.

9. Scf

Figure 20A:
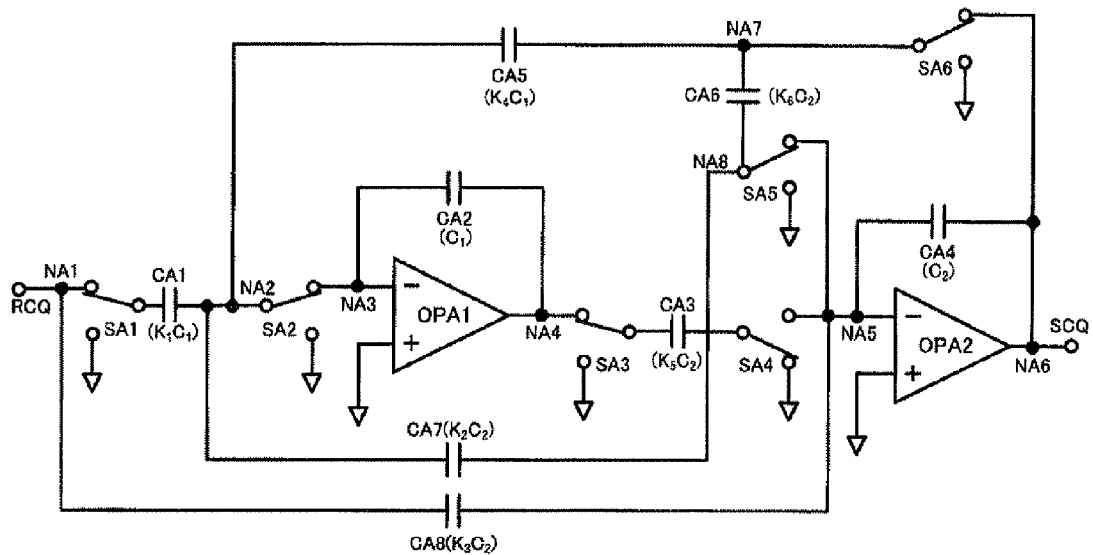
FIGS. 20A and 20B show configuration examples of an SCF.
Figure 20B:
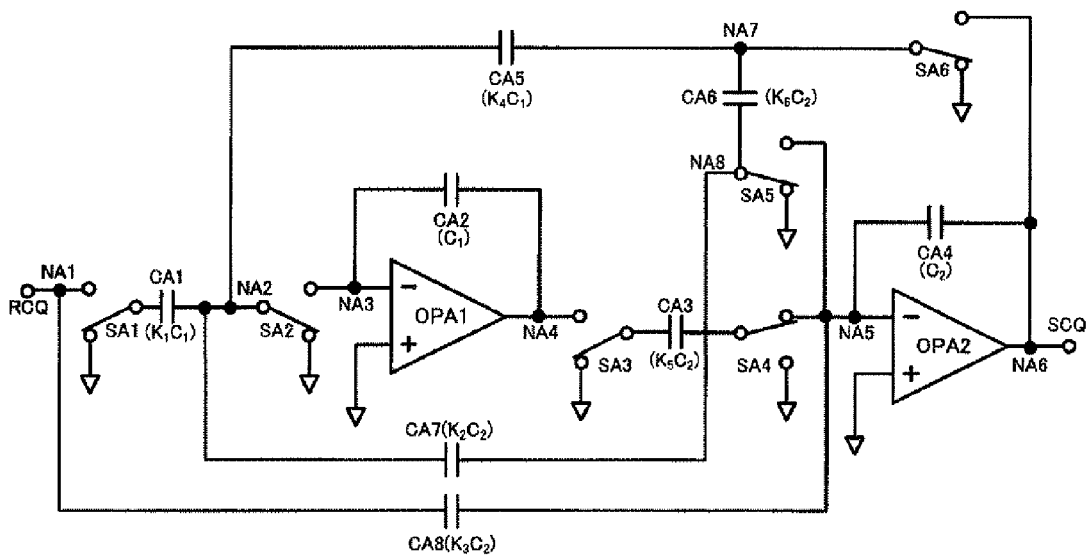

FIGS. 20A and 20B show configuration examples of the SCF 40. FIG. 20A shows a switch ON/OFF state in a sample period, and FIG. 20B shows a switch ON/OFF state in a hold period. Note that the configuration of the SCF 40 is not limited to the configuration shown in FIGS. 20A and 20B Various modifications may be made, such as changing the elements or the connection relationship. The configuration of various types of SCF known in the art may be employed.

The SCF 40 shown in FIGS. 20A and 20B includes operational amplifiers OPA1 and OPA2, switch elements SA1 to SA6, and capacitors CA1 to CA8. The switch element SA1 and the capacitor CA1 are provided between an input node NA1 and a node NA2. The switch element SA2 is provided between a node NA2 and a node NA3 of the inverting input terminal of the operational amplifier OPA1. Note that nodes of the non-inverting input terminals of the operational amplifiers OPA1 and OPA2 are connected to the analog reference voltage AGND.

The capacitor CA2 is provided between a node NA4 of the output terminal of the operational amplifier OPA1 and the node NA3. The switch element SA3, the capacitor CA3, and the switch element SA4 are provided between the node NA4 and a node NA5 of the inverting input terminal of the operational amplifier OPA2. The capacitor CA4 is provided between a node NA6 of the output terminal of the operational amplifier OPA2 and the node NA5.

The switch element SA6, the capacitor CA6, and the capacitor CA5 are provided between a node NA7 and the nodes NA6, NA8, and NA2, respectively. The switch element SA5 and the capacitor CA7 are provided between the node NA8 and the nodes NA5 and NA2, respectively. The capacitor CA8 is provided between the node NA5 and the node NA1. According to FIGS. 20A and 20B, an SC biquad filter with a low Q value can be implemented. Note that the capacitors CA7 and CA8 may be omitted.

In this embodiment, the cut-off frequency fc1 of the SCF 40 is set based on the capacitance ratio of the capacitors CA1 to CA8 included in the SCF 40.

For example, an ideal transfer function of a continuous-time Butterworth LPF is expressed by the following expression (1).

$$\text{HS\_id} = \frac{1}{\frac{1}{4} \times \frac{S^2}{\pi^2 fc1^2} + \frac{1}{2} \times \frac{S\sqrt{2}}{\pi fc1} + 1} \quad (1)$$

Converting the expression (1) into a discrete-time Z function using $S=(2/T)\times\{(1-Z-1)/(1+Z-1)\}$ yields the following expression (2), for example.

$$\text{HZ\_id} = \frac{1}{\frac{fck1^2\left(1-\frac{1}{Z}\right)^2}{\left(1+\frac{1}{Z}\right)^2 \pi^2 fc1^2} + \frac{fck1\left(1-\frac{1}{Z}\right)\sqrt{2}}{\left(1+\frac{1}{Z}\right)\pi fc1} + 1} \quad (2)$$

When the circuit configuration of the SCF 40 shown in FIGS. 20A and 20B is expressed using a Z function, the transfer function is expressed by the following expression (3). When the capacitances of the capacitors CA2 and CA4 are referred to as $C_1$ and $C_2$, respectively, the capacitances of the capacitors CA1, CA3, CA5, CA6, CA7, and CA8 are set at $K_1C_1$, $K_5C_2$, $K_4C_1$, $K_6C_2$, $K_2C_2$, and $K_3C_2$, respectively.

$$\text{HZ\_ans} = \frac{(K_2+K_3)Z^2 + (-K_2-2K_3+K_5K_1)Z + K_3}{1+(1+K_6)Z^2 + (K_5K_4-K_6-2)Z} \quad (3)$$

HZ_id=HZ_ans is solved on the assumption that HZ_id expressed by the expression (2) is equal to HZ_ans expressed by the expression (3). In this case, the sampling frequency fck1 is fixed at fs1 (see G3 in FIG. 14). Then, the coefficients $K_1, K_2, K_3, K_4, K_5,$ and $K_6$ in the expression (3) when variably setting the cut-off frequency fc1 at f11, f12, f13, f14, and f15 can be obtained. Specifically, the capacitance ratio of the capacitors CA1 to CA8 used to variably set the cut-off frequency fc1 at f11, f12, f13, f14, and f15 is determined.

According to this embodiment, the cut-off frequency fc1 of the SCF 40 can be variably set by thus changing the capacitance ratio of the capacitors CA1 to CA8 while fixing the sampling frequency fck1.

Since the folding band of the SCF 40 does not change by fixing the sampling frequency fck1, the filter frequency characteristics can be easily designed. Moreover, since the capacitance ratio of the capacitors has no size dependence, the cut-off frequency can be variably set while suppressing an increase in circuit scale.

10. Digital Filter

Figure 21A:
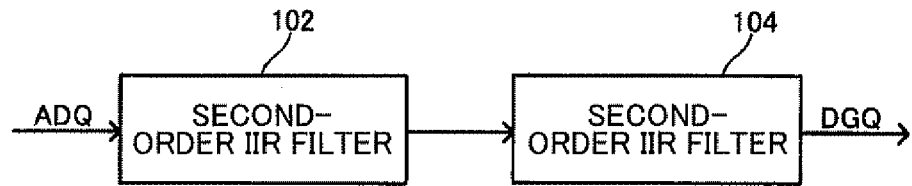
FIGS. 21A to 21C show configuration examples of a digital filter.
Figure 21B:
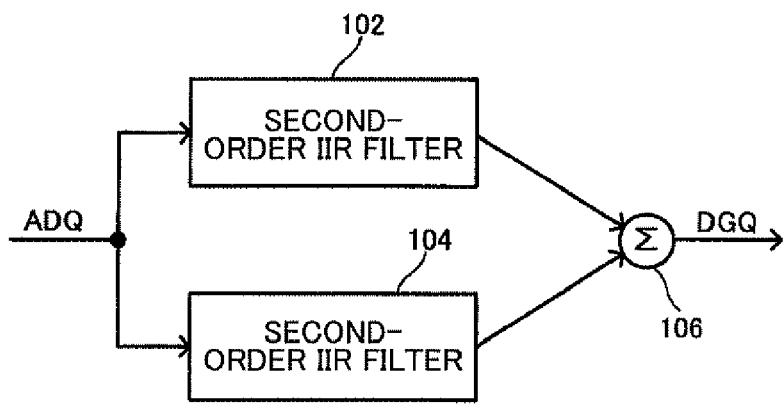

FIGS. 21A and 21B show configuration examples of the digital filter 100. In FIG. 21A, a fourth-order digital filter 100 is implemented by cascading second-order IIR filters 102 and 104. Specifically, the signal ADQ from the A/D converter 50 is input to the IIR 102, and an output signal from the IIR 102 is input to the IIR 104 in the subsequent stage. An output signal from the IIR 104 is the output signal DGQ from the digital filter 100.

In FIG. 21B, the second-order IIR filters 102 and 104 that receive the signal ADQ from the A/D converter 50 are provided in parallel. The output signals from the IIR filters 102 and 104 are summed up by an adder 106, and output as the signal DGQ.

Figure 21C:
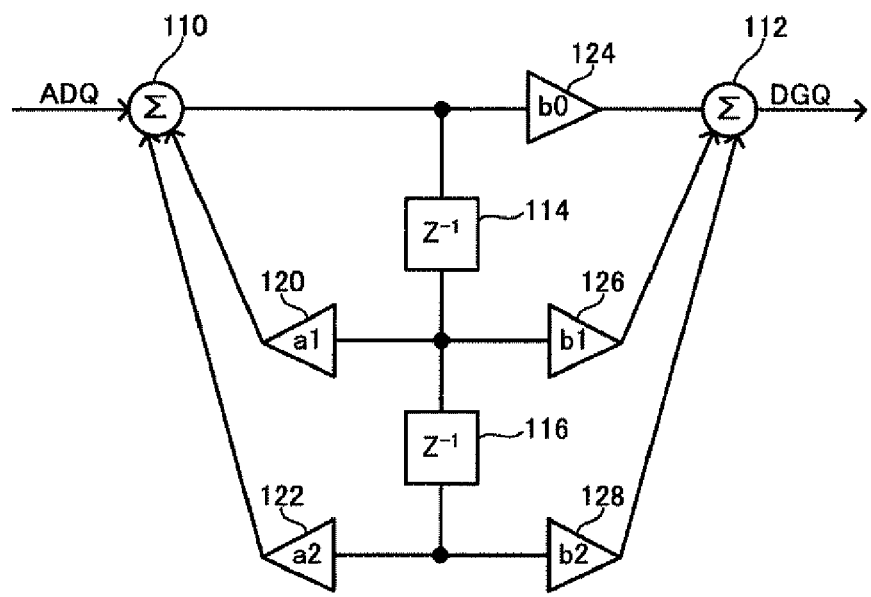

FIG. 21C shows a configuration example of each of the IIR filters 102 and 104. In FIG. 21C, delay elements 114 and 116 are implemented by a flip-flop or the like. Amplifier elements 120, 122, 124, 126, and 128 are implemented by a coefficient memory that stores a multiplication coefficient a1, a2, b0, b1, or b2 and a multiplier. Adders 110 and 112 are implemented by an addition circuit. As the actual hardware configuration, a fourth-order IIR filter can be implemented by providing a multiplier, a coefficient memory, an adder, and a plurality of registers, and performing a loop process that returns an output signal to an input, for example. Note that the configuration of the digital filter 100 is not limited to FIGS. 21A to 21C. For example, the order of the digital filter 100 may be changed, or a filter other than the IIR filter may be used.

11. Fourth Specific Example

Figure 22:
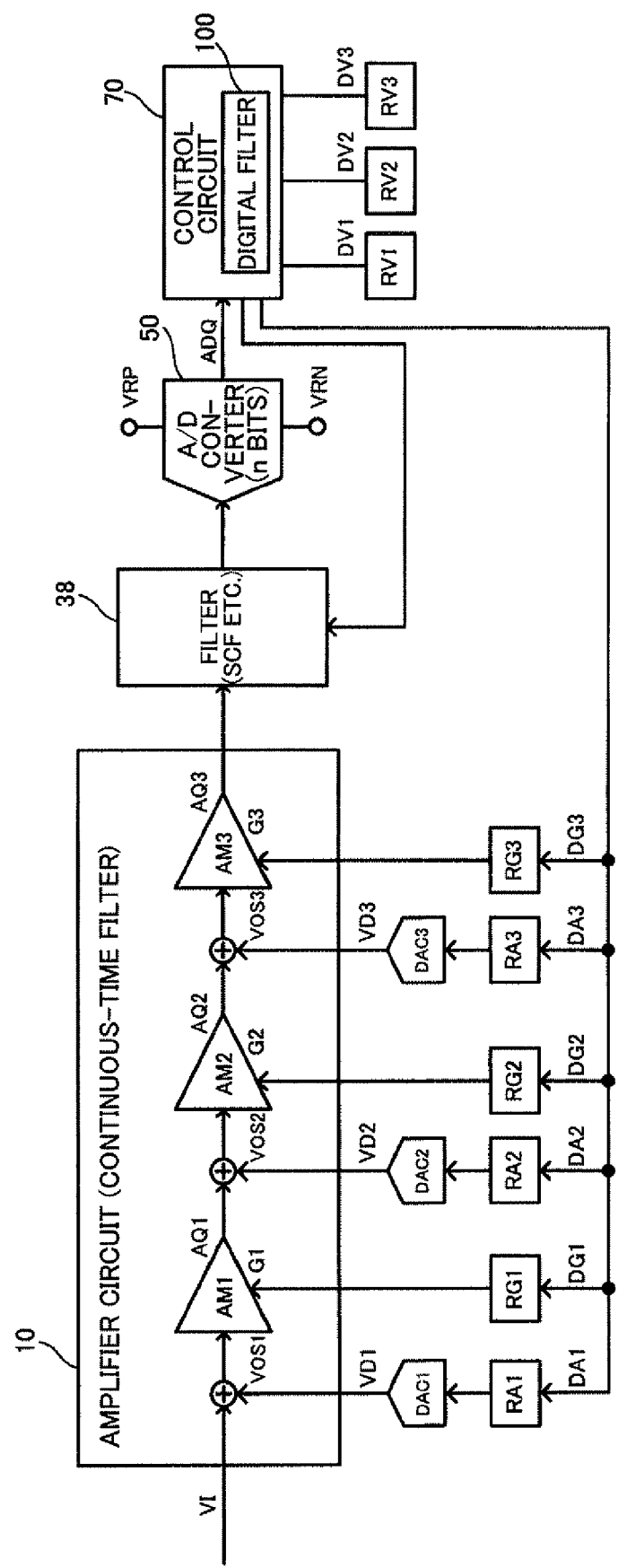
FIG. 22 shows a fourth specific example of an integrated circuit device according to one embodiment of the invention.

FIG. 22 shows a fourth specific example of this embodiment. In FIG. 22, the amplifier circuit 10 includes a plurality of amplifiers AM1 to AM3 (first to Nth amplifiers in a broad sense; N is an integer equal to or larger than two). The amplifier circuit 10 receives an input signal VI, and amplifies the input signal VI. The amplifiers AM1 to AM3 are cascaded, for example. Specifically, the amplifier AM1 receives the input signal VI from a sensor or the like, and outputs an output signal AQ1 to the amplifier AM2. The amplifier AM2 receives the output signal AQ1 from the amplifier AM1, and outputs an output signal AQ2 to the amplifier AM3. The amplifier AM3 receives the output signal AQ2 from the amplifier AM2, and outputs an output signal AQ3 to the A/D converter 50, for example. Note that the number of stages of amplifiers included in the amplifier circuit 10 is not limited to three. Various modifications may be made such as changing the number of stages of amplifiers to two or four or more, for example.

The offset adjustment registers RA1 to RA3 (first to Nth offset adjustment registers in a broad sense) are provided corresponding to the amplifiers AM1 to AM3 (first to Nth amplifiers). The offset adjustment registers RA1 to RA3 store the offset adjustment data DA1 to DA3 (first to Nth offset adjustment data in a broad sense). The offset adjustment data DA1 to DA3 is offset adjustment data for the amplifiers AM1 to AM3, and is respectively input to the D/A converters DAC1 to DAC3, for example. The offset adjustment registers RA1 to RA3 may be implemented by a flip-flop, a memory (RAM), or the like.

The D/A converters DAC1 to DAC3 (first to Nth D/A converters in a broad sense) are provided corresponding to the amplifiers AM1 to AM3. The D/A converters DAC1 to DAC3 perform an offset adjustment (amplifier offset adjustment or signal offset adjustment) based on offset adjustment data DA1 to DA3, respectively.

Specifically, the D/A converter DAC1 outputs a voltage VD1 corresponding to the offset adjustment data DA1. An offset adjustment of the amplifier AM1 is implemented by adding the voltage VD1 output from the D/A converter DAC1 to the voltage of the input signal VI. This makes it possible to cancel an offset voltage VOS1 of an operational amplifier of the amplifier AM1, or cancel the DC offset of the input signal VI. Likewise, the D/A converters DAC2 and DAC3 output voltages VD2 and VD3 corresponding to the offset adjustment data DA2 and DA3, respectively. An offset adjustment of the amplifiers AM2 and AM3 is implemented by adding the voltages VD2 and VD3 output from the D/A converters DAC2 and DAC3 to the voltages of the output signals AQ1 and AQ2 from the amplifiers AM1 and AM2, respectively. This makes it possible to cancel offset voltages VOS2 and VOS3 of operational amplifiers of the amplifiers AM2 and AM3, or cancel the DC offset of the input signal VI. A D/A converter using a ladder resistor circuit or the like may be used as the D/A converters DAC1 to DAC3. Specifically, a D/A converter that includes a ladder resistor circuit and an operational amplifier provided in the subsequent stage of the ladder resistor circuit may be used as the D/A converters DAC1 to DAC3.

Gain adjustment registers RG1 to RG3 (first to Nth gain adjustment registers in a broad sense) are provided corresponding to the amplifiers AM1 to AM3. The gain adjustment registers RG1 to RG3 store gain adjustment data DG1 to DG3 (first to Nth gain adjustment data in a broad sense). The gain adjustment data DG1 to DG3 adjusts the gains G1 to G3 of the amplifiers AM1 to AM3. Specifically, the gains G1 to G3 of the amplifiers AM1 to AM3 are adjusted by adjusting the resistances of resistors (element values of passive elements) included in the amplifiers AM1 to AM3 based on the gain adjustment data DG1 to DG3, for example. This makes it possible to implement a gain adjustment corresponding to the amplitude of the input signal VI. The gain adjustment registers RG1 to RG3 may be implemented by a flip-flop, a memory, or the like.

Offset value storage sections RV1 to RV3 (first to Nth offset value storage sections in a broad sense) store offset value data DV1 to DV3 (first to Nth offset value data in a broad sense) that is offset value data relating to the amplifiers AM1 to AM3. The offset value data DV1 to DV3 respectively corresponds to the offset voltages VOS1 to VOS3 of the amplifiers AM1 to AM3, for example. The offset adjustment data DA1 to DA3 may be set based on the offset value data DV1 to DV3, the 1LSB-equivalent voltages of the D/A converters DAC1 to DAC3, and the like, for example.

The offset value storage sections RV1 to RV3 may be implemented by a register formed by a flip-flop, a memory, or the like, or may be implemented by a nonvolatile memory (e.g., EEPROM), a fuse element, or the like.

In FIG. 22, the D/A converters DAC1 to DAC3, the offset adjustment registers RA1 to RA3, the gain adjustment registers RG1 to RG3, and the offset value storage sections RV1 to RV3 are provided corresponding to all of the amplifiers AM1 to AM3 included in the amplifier circuit 10. Note that the D/A converters, the offset adjustment registers, the gain adjustment registers, and the offset value storage sections may be provided corresponding to only some (e.g., two stages) of the amplifiers AM1 to AM3.

The control circuit 70 sets an offset adjustment of the amplifier circuit 10 by setting the offset adjustment data DA1 to DA3 in the offset adjustment registers RA1 to RA3. The control circuit 70 sets a gain adjustment of the amplifier circuit 10 by setting the gain adjustment data DC1 to DG3 in the gain adjustment registers RG1 to RG3. Specifically, the control circuit 70 reads the offset value data DV1 to DV3 stored in the offset value storage sections RV1 to RV3. The control circuit 70 calculates the offset adjustment data DA1 to DA3 based on the offset value data DV1 to DV3, and sets (stores) the offset adjustment data DA1 to DA3 in the offset adjustment registers RA1 to RA3.

When subjecting the amplifiers AM1 to AM3 to amplifier offset calibration, the control circuit 70 calculates the offset value data DV1 to DV3 based on the digital data ADQ from the A/D converter 50 and the gains G1 to G3 (gain adjustment data) of the amplifiers AM1 to AM3, and sets (stores) the offset value data DV1 to DV3 in the offset value storage sections RV1 to RV3. Specifically, when performing amplifier offset calibration that automatically cancels the offset voltages VOS1 to VOS3 of the amplifiers AM1 to AM3 before the input signal VI is input from a sensor or the like, the control circuit 70 measures the offset voltages VOS1 to VOS3 of the amplifiers AM1 to AM3 by monitoring the digital data ADQ from the A/D converter 50. The control circuit 70 calculates the offset value data DV1 to DV3 corresponding to the offset voltages VOS1 to VOS3 of the amplifiers AM1 to AM3 based on the gains G1 to G3 of the amplifiers AM1 to AM3 when measuring the offset voltages VOS1 to VOS3, and stores the offset value data DV1 to DV3 in the offset value storage sections RV1 to RV3.

When subjecting the input signal VI to signal offset calibration, the control circuit 70 calculates the offset adjustment data DA1 to DA3 based on the offset value data DV1 to DV3 stored in the offset value storage sections RV1 to RV3, and sets the offset adjustment data DA1 to DA3 in the offset adjustment registers RA1 to RA3. Specifically, the offset voltages VOS1 to VOS3 of the amplifiers AM1 to AM3 are canceled by setting the offset adjustment data PA1 to DA3 corresponding to the offset value data DV1 to DV3 in the offset adjustment registers RA1 to RA3. The control circuit 70 then subjects the input signal VI to signal offset calibration.

In the fourth specific example shown in FIG. 22, a plurality of amplifiers AM1 to AM3 are provided in the amplifier circuit 10, and a plurality of D/A converters DAC1 to DAC3 are provided corresponding to the amplifiers AM1 to AM3. Specifically, the integrated circuit device has a multi-stage amplifier/multi-stage DAC configuration.

According to this configuration, an offset adjustment that cancels the offset voltages of the amplifiers AM1 to AM3, a DC offset of the input signal VI, and the like can be implemented while suppressing an increase in the circuit scale of the D/A converters DAC1 to DAC3. Specifically, an accurate offset adjustment can be implemented with a small circuit configuration as compared with a single-stage amplifier/single-stage DAC configuration.

Figure 23:
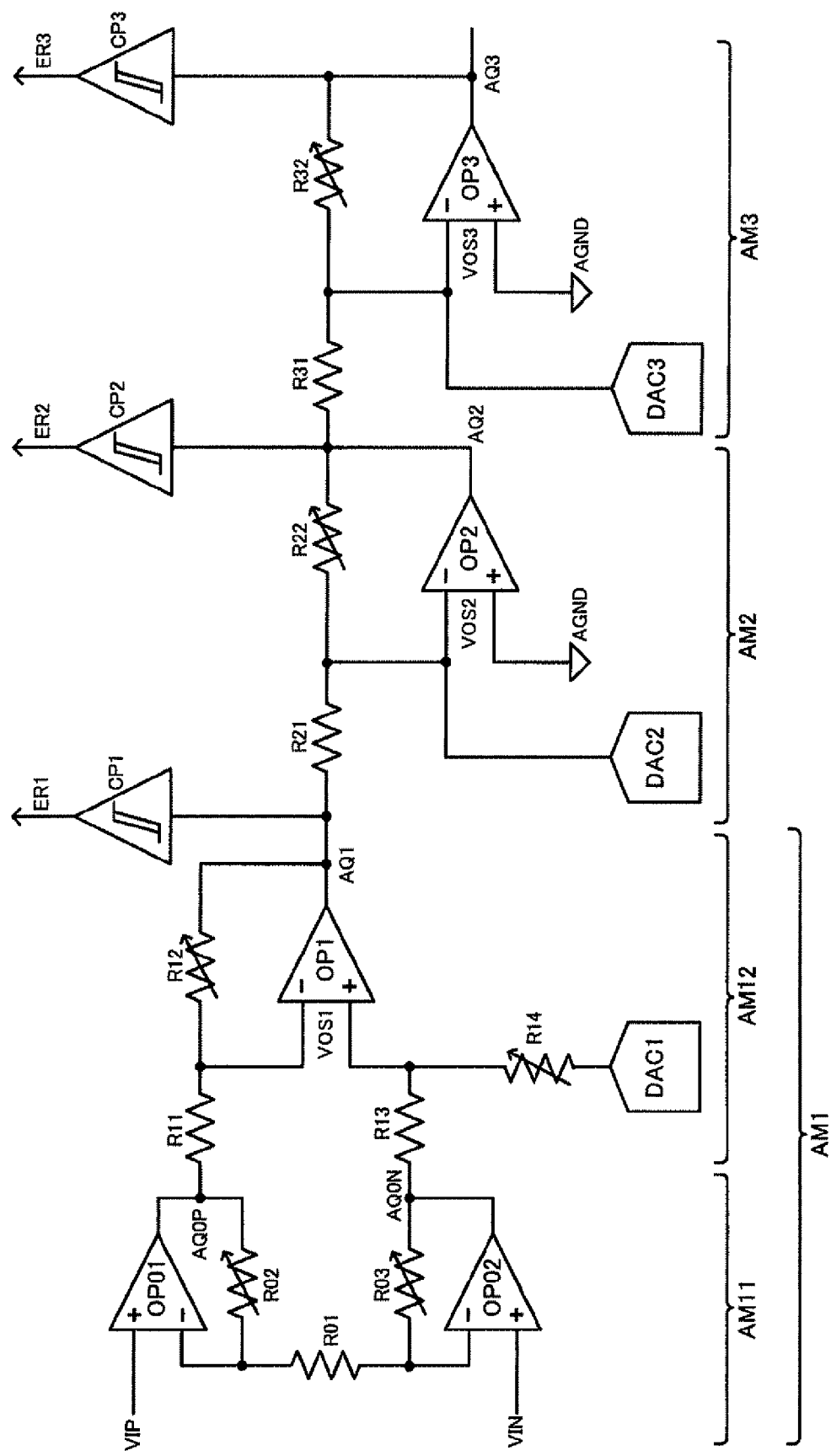
FIG. 23 shows a specific circuit configuration example of an amplifier circuit and a determination circuit.

FIG. 23 shows a specific circuit configuration example of the amplifier circuit 10. The amplifier AM1 includes amplifiers AM11 and AM12. The amplifier AM11 includes operational amplifiers OP01 and OP02 and resistors R01, R02, and R03. The resistors R02 and R03 are variable resistors, for example. The amplifier AM12 includes an operational amplifier OP1 and resistors R11, R12, R13, and R14. The resistors R12 and R14 are variable resistors, for example. The amplifiers AM11 and AM12 form an instrumentation amplifier that utilizes the operational amplifiers OP01, OP02, and OP1. The instrumentation amplifier is a differential-input/single-ended output balanced-input amplifier. The instrumentation amplifier is characterized in that the common mode rejection ratio (CMRR) can be increased. A sensor that outputs differential detection signals and a sensor that outputs a single-ended detection signal can be connected to the first-stage differential amplifier by utilizing the instrumentation amplifier as the first-stage differential amplifier. For example, when connecting a sensor that outputs differential detection signals to the first-stage differential amplifier, a first signal (positive) that forms the differential detection signals is input as the signal VIP, and a second signal (negative) that forms the differential detection signals is input as the signal VIN. When connecting a sensor that outputs a single-ended detection signal to the first-stage differential amplifier, the single-ended detection signal is input as the signal VIP, and a VIN terminal is set at a reference analog voltage AGND, for example.

The amplifier AM2 includes an operational amplifier OP2 and resistors R21 and R22. The resistor R22 is a variable resistor, for example. The gain G2 of the amplifier AM2 is adjusted using the resistor R22. The amplifier AM3 includes an operational amplifier OP3 and resistors R31 and R32. The resistor R32 is a variable resistor, for example. The gain G3 of the amplifier AM3 is adjusted using the resistor R32. The amplifiers AM2 and AM3 are inverting amplifiers.

Specifically, the output terminal of the operational amplifier OP2 is connected to the output node of the inverting amplifier AM2. The first resistor R21 is provided between the inverting input terminal (first input terminal in a broad sense) of the operational amplifier OP2 and the input node of the inverting amplifier AM2. The second resistor R22 is provided between the output node of the inverting amplifier AM2 and the inverting input terminal of the operational amplifier OP2. The non-inverting input terminal (second input terminal in a broad sense) of the operational amplifier OP2 is set at the analog reference power supply voltage AGND, for example. The configuration of the inverting amplifier AM3 is the same as the configuration of the inverting amplifier AM2.

It is unnecessary to use rail-to-rail operational amplifiers as the operational amplifiers OP2 and OP3 of the amplifiers AM2 and AM3 by utilizing the inverting amplifiers as the amplifiers AM2 and AM3. For example, when utilizing non-inverting amplifiers as the amplifiers AM2 and AM3, a signal having a large amplitude is distorted. It is necessary to use a rail-to-rail operational amplifier in order to prevent such a problem. However, a rail-to-rail operational amplifier has a disadvantage in that the circuit scale of the operational amplifier increases and it is difficult to improve the characteristics of the operational amplifier. The above-mentioned problems can be solved by utilizing the inverting amplifiers as the amplifiers AM2 and AM3.

In FIG. 23, the D/A converters DAC1, DAC2, and DAC3 that adjust the offset voltages VOS1, VOS2, and VOS3 of the operational amplifiers OP1, OP2, and OP3 and the DC offset of the input signal are provided.

In FIG. 23, a plurality of comparators (comparison circuits) CP1, CP2, and CP3 are provided as a determination circuit that determines the amplitudes of the output signals from the amplifiers AM1 to AM3. The comparators CP1, CP2, and CP3 respectively compare the output signals AQ1, AQ2, and AQ3 from the amplifiers AM1 (AM11 and AM12), AM2, and AM3 with the high-potential-side determination voltage VCH and the low-potential-side determination voltage VCL. The comparators CP1, CP2, and CP3 determine whether or not the voltages of the output signals AQ1, AQ2, and AQ3 are within the determination voltage range specified by the high-potential-side determination voltage VCH and the low-potential-side determination voltage VCL. When the comparators CP1, CP2, and CP3 have determined that the voltages of the output signals AQ1, AQ2, and AQ3 are not within the determination voltage range, the comparators CP1, CP2, and CP3 respectively activate error signals ER1, ER2, and ER3 (signal DRS) that indicate the determination result, and output the error signals ER1, ER2, and ER3 to the control circuit 70. For example, when the voltages of the output signals AQ1, AQ2, and AQ3 are outside the determination voltage range, the comparators CP1, CP2, and CP3 respectively activate the signals ER1, ER2, and ER3. Each of the comparators CP1 to CP3 may include a first comparator that compares the voltage of the output signal with the determination voltage VCH, and a second comparator that compares the voltage of the output signal with the determination voltage VCL.

It is desirable that each of the comparators CP1 to CP3 have a hysteresis function. For example, when the voltage (peak voltage) of one of the signals AQ1 to AQ3 is close to the determination voltage VCH or VCL, a situation in which the signals ER1, ER2, and ER3 are alternately set at the H level and the L level occurs. This causes malfunction of the circuit. Such a situation can be prevented by providing the comparators CP1 to CP3 with a hysteresis function (hysteresis characteristics using two threshold voltages). Note that a peak-hold circuit that holds the peak voltage of the output signals AQ1 to AQ3 may be provided instead of a hysteresis type comparator.

When providing the determination circuit that includes the comparators CP1 to CP3 (see FIG. 23), a selector that selects one of the output signals from the amplifiers AM1 to AM3 (first to Nth amplifiers) of the amplifier circuit 10 and outputs the selected output signal to the A/D converter 50 as a selector output signal may be provided. The control circuit 70 instructs the selector to select one of the output signals from the amplifiers AM1 to AM3 based on the determination result (error signals ER1 to ER3) of the determination circuit (comparators CP1 to CP3). According to this configuration, even if the input signal VI that varies in amplitude and the like has been input, a signal within an optimum voltage range is input to the A/D converter 50. Therefore, the dynamic range of the A/D converter 50 can be increased. In this case, the selector may be implemented by utilizing the multiplexer 90 shown in FIGS. 6 and 7.

12. Multi-Stage Amplifier/Multi-Stage Dac Configuration

In FIG. 22, the amplifier circuit has a multi-stage amplifier/multi-stage DAC configuration. The advantages of the multi-stage amplifier/multi-stage DAC configuration are described below.

As the configuration of the amplifier circuit, a configuration in which a high-pass filter (HPF) that includes a capacitor C and a resistor R is provided in the preceding stage of an amplifier AM (see FIG. 24A), or a single-stage amplifier/single-stage DAC configuration (see FIG. 24B) may be employed, for example.

In the configuration using the HPF (FIG. 24A), a DC component is cut off utilizing the HPF to cancel the DC offset. The configuration using the HPF achieves high accuracy, but results in a decrease in calibration response speed and an increase in size, as shown in FIG. 24C.

Specifically, the frequency band of the input signal VI (detection signal) from the sensor varies (e.g., within the range from 1 Hz to 16 KHz) corresponding to the type of sensor For example, when the frequency of the input signal VI is 1 Hz, it is necessary to reduce the cut-off frequency of the HPF shown in FIG. 24A to a value (e.g., 0.1 Hz or less) sufficiently lower than 1 Hz so that the input signal VI having a frequency of 1 Hz passes through.

However, since the cut-off frequency of the HPF is determined by the reciprocal of CR, it is necessary to increase the capacitance of the capacitor C and the resistance of the resistor R in order to reduce the cut-off frequency of the HPF. Therefore, the size of the capacitor C and the resistor R increases when setting the cut-off frequency at 0.1 Hz, for example. When the capacitor C and the resistor R are provided as external parts, convenience to the user is impaired. Moreover, it is difficult to variably set the capacitance and the resistance corresponding to the frequency band of the input signal VI. When the capacitance of the capacitor C and the resistance of the resistor R are increased, the calibration response speed decreases so that quick calibration cannot be implemented.

The single-stage amplifier/single-stage DAC configuration shown in FIG. 24B achieves a high calibration response speed, but results in an increase in size and a decrease in accuracy, as shown in FIG. 24C.

On the other hand, the multi-stage amplifier/multi-stage DAC configuration according to this embodiment has advantages over the configuration using the HPF and the single-stage amplifier/single-stage DAC configuration with regard to the calibration response speed, size, and accuracy. The details are described below.

For example, when canceling a DC offset VS (input offset) of the input signal VI using the single-stage amplifier/single-stage DAC configuration shown in FIG. 24B, the offset adjustment data DA may be set so that VD=−VS.

An output range QR required for the D/A converter DAC shown in FIG. 24B is almost equal to the DC offset VS of the input signal VI (e.g., about 3 V).

The D/A converter DAC is required to have an accuracy such that the A/D converter 51 does not produce an error. Therefore, when the 1LSB-equivalent voltage (DAC accuracy) of the D/A converter DAC is referred to as 1LSB, the 1LSB-equivalent voltage (A/D accuracy) of the A/D converter 51 is referred to as ADLSB, and the gain of the amplifier AM is referred to as G, the relationship "VLSB≦ADLSB/G" is satisfied. Therefore, when ADLSB=0.003 V and G=32, VLSB≦0.003/32=93.75 μV.

The number k of bits required for the D/A converter DAC is determined by $2^k$≦QR/VLSB. Therefore, when the output range QR of the D/A converter DAC is about 3 V, the number k of bits required for the D/A converter DAC is 15 (k=15) since $2^{15}$=32768≧3/(0.003/32)=32000.

Specifically, when using the single-stage amplifier/single-stage DAC configuration, a 15-bit DAC is required (see FIG. 25A). For example, since it is necessary to reduce the 1LSB-equivalent voltage VLSB (DAC accuracy) as the accuracy of the A/D converter 51 increases (the 1LSB-equivalent voltage ADLSB decreases), it is necessary to further increase the number of bits of the D/A converter DAC, as indicated by the relational expression "$2^k$≧QR/VLSB".

However, the size of the D/A converter DAC increases exponentially with respect to the number of bits, as shown in FIG. 24D. Therefore, when the number of bits of the D/A converter DAC is set at 15, the size of the D/A converter DAC increases to a large extent. As a result, the size of the integrated circuit device also increases. Specifically, it is difficult to reduce the circuit scale while increasing the calibration accuracy when using the single-stage amplifier/single-stage DAC configuration.

In this embodiment, the multi-stage amplifier/multi-stage DAC configuration is employed, as shown in FIG. 25B. The DC offset of the input signal VI is referred to as VS, the gains of the amplifiers AM1 to AM3 are respectively referred to as G1 to G3, the output voltages of the D/A converters DAC1 to DAC3 are respectively referred to as VD1 to VD3, and the output voltage of the amplifier AM3 is referred to as VAQ. In this case, the relationship "VAQ=G1×G2×G3×VS+G1×G2×G3×VD1+G2×G3×VD2×G3×VD3" is satisfied.

Therefore, the DC offset VS of the input signal VI can be canceled by setting the output voltages VD1 to VD3 of the D/A converters DAC1 to DAC3 so that VS=−{VD1+VD2/G1+VD3/(G1×G2)} is satisfied.

When using the multi-stage amplifier/multi-stage DAC configuration shown in FIG. 25B, the output range QR1 of the D/A converter DAC1 may be set to be almost equal to the DC offset VS of the input signal VI (e.g., about 3 V). Specifically, most of the DC offset VS is corrected by the output voltage VD1 of the first-stage D/A converter DAC1, and an error value is corrected by the output voltages VD2 and VD3 of the subsequent-stage D/A converters DAC2 and DAC3.

When the 1LSB-equivalent voltages (DAC accuracy) of the D/A converters DAC1, DAC2, and DAC3 are referred to as VLSB1, VLSB2, and VLSB3, the output range QR2 of the D/A converter DAC2 satisfies the relationship "QR2≧G1× VLSB1" (described in detail later). The output range QR3 of the D/A converter DAC3 satisfies the relationship "QR3≧G2×VLSB2".

For example, since the 1LSB-equivalent voltage VLSB3 (accuracy) required for the D/A converter DAC3 is within a range such that the A/D converter 50 does not produce an error, the relationship "VLSB3≦ADLSB/G3" is satisfied when the 1LSB-equivalent voltage of the A/D converter 50 is referred to as ADLSB.

The number k of bits required for the D/A converter DAC1 is determined by the relational expression "$2^k ≧ QR1/VLSB1$". Likewise, the numbers k of bits required for the D/A converters DAC2 and DAC3 are respectively determined by the relational expressions "$2^k ≧ QR2/VLSB2$" and "$2^k ≧ QR3/VLSB3$".

Therefore, when the gains G1, G2, and G3 of the amplifiers AM1 to AM3 are 4, 4, and 2, respectively, the relationship shown in FIG. 25C is satisfied, for example.

Specifically, the output range QR1 of the D/A converter DAC1 is almost equal to the DC offset VS of the input signal VI (e.g., about 3 V). Therefore, when the number k of bits of the D/A converter DAC1 is five (k=5), the 1LSB-equivalent voltage VLSB1 of the D/A converter DAC1 may be set at 96 mV (see FIG. 25C) based on the relational expression "$VLSB1=QR1/2^5$".

The output range QR2 and the 1LSB-equivalent voltage VLSB2 of the D/A converter DAC2 satisfy the relationships "QR2≧G1×VLSB1" and "$VLSB2=Q2/2^5$". Therefore, the output range QR2 and the 1LSB-equivalent voltage VLSB2 may be set so that QR2=G1×VLSB1=4×96 mV=0.384 V and $VLSB2=QR2/2^5=0.384/2^5$ V=12 mV.

The output range QR2 and the 1LSB-equivalent voltage VLSB3 of the D/A converter DAC3 satisfy the relationships "QR3≧G2×VLSB2" and "$VLSB3=QR3/2^5$". Therefore, the output range QR3 and the 1LSB-equivalent voltage VLSB3 may be set so that QR3=G2×VLSB2=4×12 mV=48 V and $VLSB3=QR3/2^5=48/2^5$ V=1.5 mV.

As is clear from the comparison between FIG. 25A and FIG. 25C, the single-stage amplifier/single-stage DAC configuration requires a DAC resolution of 15 bits while it suffices to provide three 5-bit D/A converters DAC1 to DAC3 when using the multi-stage amplifier/multi-stage DAC configuration, for example. As is clear from FIG. 24D, the circuit area of one 15-bit D/A converter DAC is significantly larger than the circuit area of the three 5-bit D/A converters DAC1 to DAC3. Therefore, the circuit scale can be significantly reduced by the multi-stage amplifier/multi-stage DAC configuration according to this embodiment as compared with the single-stage amplifier/single-stage DAC configuration.

According to the single-stage amplifier/single-stage DAC configuration shown in FIG. 25A, the 1LSB-equivalent voltage VLSB (DAC accuracy) is 93.75 µV even though the number of bits of the D/A converter DAC is increased to 15. As a result, the offset calibration accuracy cannot be increased to a large extent.

According to the multi-stage amplifier/multi-stage DAC configuration shown in FIG. 25C, most of the DC offset VS is corrected by the first-stage D/A converter DAC1, and a correction error is corrected by the subsequent-stage D/A converters DAC2 and DAC3. Since the 1LSB-equivalent voltage VLSB3 (DAC accuracy) of the D/A converter DAC3 is as small as 1.5 mV, accurate offset calibration can be implemented as compared with the single-stage amplifier/single-stage DAC configuration shown in FIG. 25A.

13. Method of setting output range and 1lsb-equivalent voltage of d/a Converter

A method of setting the output range and the 1LSB-equivalent voltage of the D/A converter according to this embodiment is described in detail below.

Figure 26A:
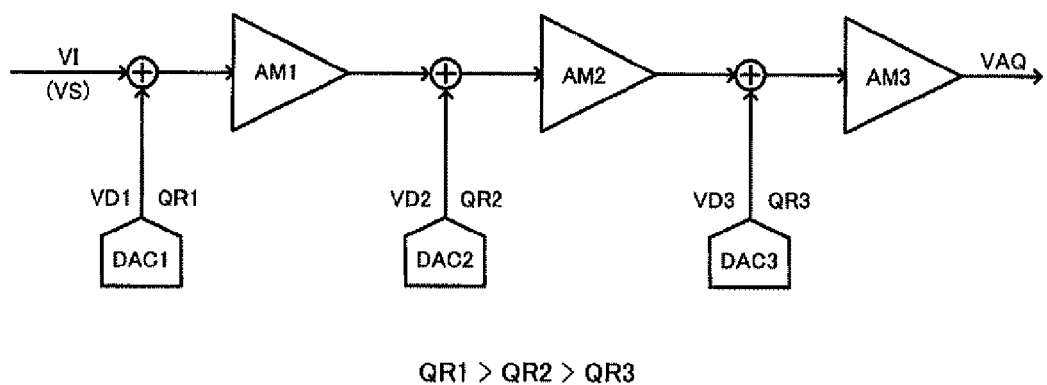
FIGS. 26A and 26B are views illustrative of a method of setting the output range and the 1LSB-equivalent voltage of a D/A converter

In FIG. 26A, the output range of the subsequent-stage D/A converter is set to be narrower than the output range of the preceding-stage D/A converter. The output range of the D/A converter DAC1 (ith D/A converter) among the D/A converters DAC1 to DAC3 (first to Nth D/A converters) is referred to as QR1, and the output range of the D/A converter DAC2 ((i+1)th D/A converter) in the subsequent stage of the D/A converter DAC1 is referred to as QR2. The output ranges of the D/A converters DAC1 and DAC2 are set so that the relationship "QR1>QR2" is satisfied. Likewise, the output ranges of the D/A converters DAC2 and DAC3 are set so that the relationship "QR2>QR3" is satisfied. Note that modifications may be made, such as setting the output ranges so that the relationships "QR1>QR2" and "QR2=QR3" are satisfied, or setting the output ranges so that the relationships "QR1=QR2" and "QR2>QR3" are satisfied.

Figure 26B:
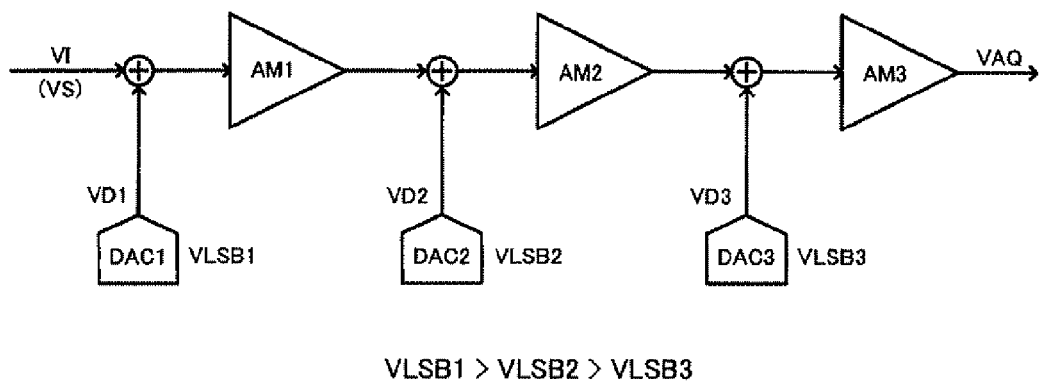

In FIG. 26B, the 1LSB-equivalent voltage of the subsequent-stage D/A converter is set to be lower than the 1LSB-equivalent voltage of the preceding-stage D/A converter. Specifically, when the 1LSB-equivalent voltage of the D/A converter DAC1 (ith D/A converter) among the D/A converters DAC1 to DAC3 is referred to as VLSB1 and the 1LSB-equivalent voltage of the D/A converter DAC2 ((i=1)th D/A converter) in the subsequent stage of the D/A converter DAC1 is referred to as VLSB2, the relationship "VLSB1>VLSB2" is satisfied. Likewise, the 1LSB-equivalent voltages of the D/A converters DAC2 and DAC3 are set so that the relationship "LSB2>VLSB3" is satisfied. Note that modifications may be made, such as setting the 1LSB-equivalent voltages so that the relationships "VLSB1>VLSB2" and "VLSB2=VLSB3" are satisfied, or setting the 1LSB-equivalent voltages so that the relationships "VLSB1=VLSB2" and "VLSB2>VLSB3" are satisfied.

Figure 27:
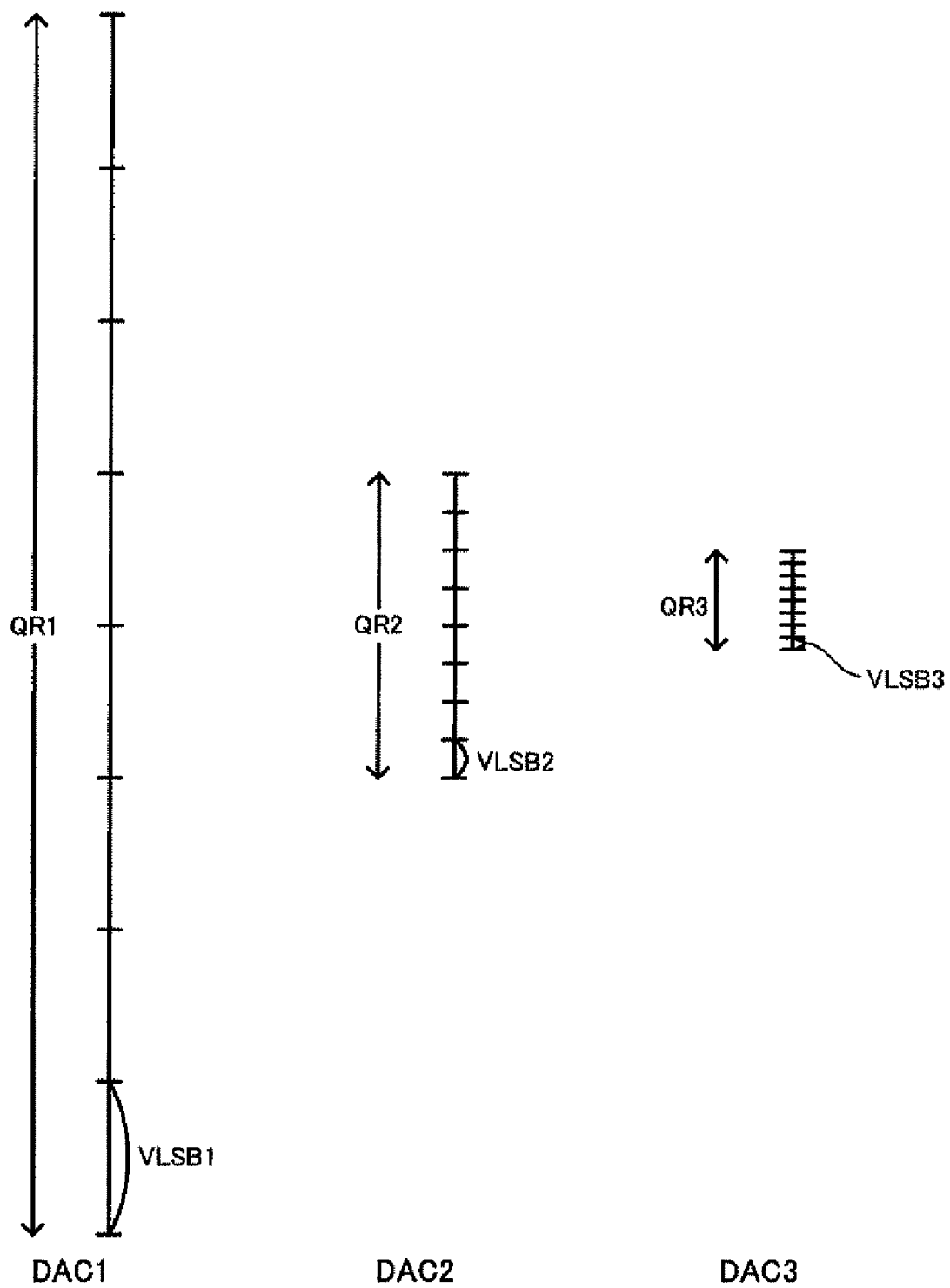
FIG. 27 is a view illustrative of a method of setting the output range and the 1LSB-equivalent voltage of a D/A converter

FIG. 27 is a view showing the details of the relationships shown in FIGS. 26A and 26B. As shown in FIG. 27, the output range QR1 of the preceding-stage D/A converter DAC1 is wider than the output range QR3 of the subsequent-stage D/A converter DAC3. The 1LSB-equivalent voltage VLSB1 of the preceding-stage D/A converter DAC1 is higher than the 1LSB-equivalent voltage VLSB3 of the subsequent-stage D/A converter DAC3.

When the output range QR1 of the D/A converter DAC1 is increased, as shown FIG. 26A, most of the DC offset VS of the input signal VI can be canceled by the output voltage VD1 of the D/A converter DAC1 by setting the output range QR1 of the D/A converter DAC1 to be almost equal to the range of the DC offset VS of the input signal VI, for example. Since most of the DC offset VS is canceled by the D/A converter DAC1, an error value that has not been removed by the D/A converter DAC1 can be removed by the output voltages VD2 and VD3 of the subsequent-stage D/A converters DAC2 and DAC3 without increasing the output ranges QR2 and QR3 of the subsequent-stage D/A converters DAC2 and DAC3 to a large extent. Specifically, the DC offset VS can be appropriately corrected by setting the output ranges so that the relationship "QR1>QR2>QR3" is satisfied.

The D/A converter DAC1 roughly corrects the DC offset VS, and accurate offset correction is implemented by the subsequent-stage D/A converters DAC2 and DAC3. Therefore, since the D/A converter DAC1 need not have high accuracy, the 1LSB-equivalent voltage VLSB1 can be increased, as shown in FIG. 26B. On the other hand, the D/A converter DAC2 must accurately correct an error value that has not been removed by the D/A converter DAC1, and the D/A converter DAC3 must accurately correct an error value that has not been removed by the D/A converter DAC2. Therefore, the 1LSB-equivalent voltages VLSB2 and VLSB3 are set to be lower than the 1LSB-equivalent voltage VLSB1. Specifically, the DC offset VS can be accurately calibrated by setting the 1LSB-equivalent voltages so that the relationship "VLSB1>VLSB2>VLSB3" is satisfied.

For example, when using the single-stage amplifier/single-stage DAC configuration shown in FIG. 24B, if the output range QR of the D/A converter DAC is increased in order to deal with the range of the DC offset VS and the 1LSB-equivalent voltage of the D/A converter DAC is reduced in order to implement accurate calibration, the number of bits of the D/A converter DAC increases (see FIG. 25A). As a result, the circuit scale increases.

On the other hand, when the relationships "QR1>QR2>QR3" and "VLSB1>VLSB2>VLSB3" are satisfied (see FIGS. 26A and 26B), the number of bits of the D/A converter DAC1 need not be increased to a large extent even if the output range QR of the D/A converter DAC is increased in order to deal with the range of the DC offset VS since the 1LSB-equivalent voltage VLSB1 is high, as shown in FIG. 27. Therefore, the number of bits of the D/A converter DAC1 can be reduced (see FIG. 25C).

On the other hand, the number of bits of the D/A converter DAC3 need not be increased to a large extent even if the 1LSB-equivalent voltage VLSB3 of the D/A converter DAC3 is reduced in order to implement accurate calibration since the output range VR3 of the D/A converter DAC3 is narrow, as shown in FIG. 27. Therefore, the number of bits of the D/A converter DAC3 can also be reduced (see FIG. 25C).

According to the method shown in FIGS. 26A and 26B, an increase in circuit scale can be prevented while increasing the calibration accuracy when calibrating the DC offset VS.

Figure 28:
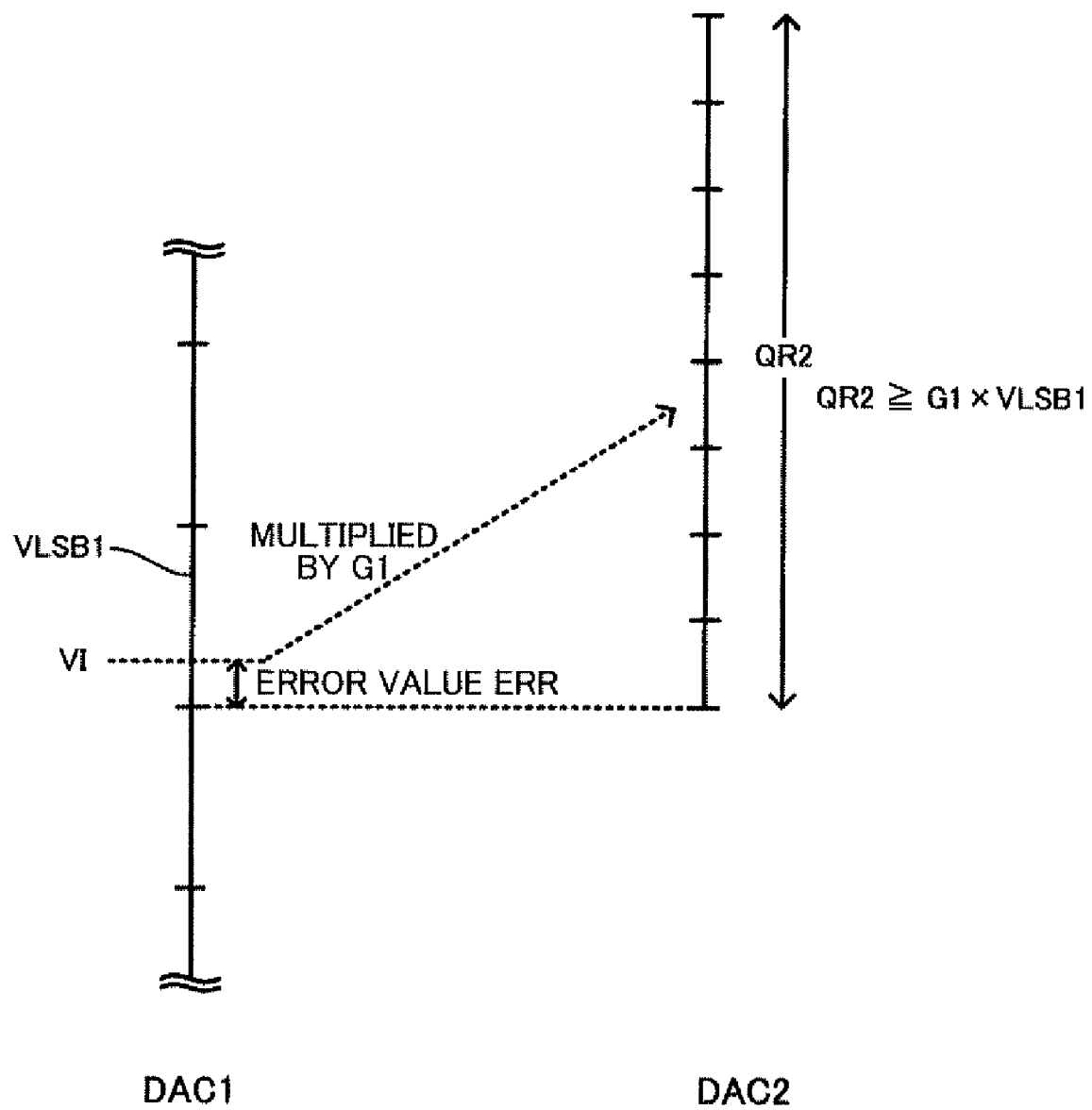
FIG. 28 is a view illustrative of a method of setting the output range and the 1LSB-equivalent voltage of a D/A converter.

When the gain of the amplifier AM1 (ith amplifier) is referred to as G1 and the 1LSB-equivalent voltage of the D/A converter DAC1 (ith D/A converter) is referred to as VLSB1, the relationship "$Q2 \geq G1 \times VLSB1$" is satisfied, as shown in FIG. 28. Likewise, when the gain of the amplifier AM2 is referred to as G2 and the 1LSB-equivalent voltage of the D/A converter DAC2 is referred to as VLSB2, the relationship "$QR3 \geq G2 \times VLSB2$" is satisfied.

Specifically, an error value ERR that has not been removed by the D/A converter DAC1 must be removed by the D/A converter DAC2, as shown in FIG. 28. The error value ERR is amplified by the amplifier AM1 by a factor of G1. Therefore, the output range QR2 of the D/A converter DAC2 must be equal to or greater than G1×ERR. Specifically, the relationship "$QR2 \geq G1 \times ERR$" is satisfied.

Since the error value ERR is a quantization error of the D/A converter DAC1, the error value ERR is equal to or less than the 1LSB-equivalent voltage VLSB1 of the D/A converter DAC1. Specifically, the relationship "$ERR \leq VLSB1$" is satisfied. Therefore, the relationship "$QR2 \geq G1 \times VLSB1$" is satisfied from the relationships "$QR2 \geq G1 \times ERR$" and "$ERR \leq VLSB1$". Likewise, the relationship "$QR3 \geq G2 \times VLSB2$" is satisfied. These relationships ensure that the error value that has not been removed by the preceding-stage D/A converter can be removed by the subsequent-stage D/A converter.

14. Electronic Instrument

An electronic instrument according to one embodiment of the invention is described below with reference to FIGS. 29A to 29C. Note that the electronic instrument according to this embodiment is not limited to the configurations shown in FIGS. 29A to 29C. Various modifications may be made such as omitting some of the elements or adding other elements.

Figure 29A:
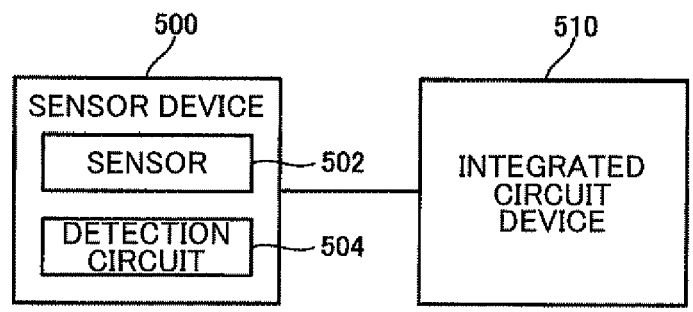
FIGS. 29A to 29C show configuration examples of an electronic instrument according to one embodiment of the invention.

FIG. 29A shows a first configuration example of the electronic instrument according to this embodiment. The electronic instrument according to the first configuration example includes a sensor device 500, and an integrated circuit device 510 (analog front-end (AFE) circuit) according to the above embodiment. In the electronic instrument shown in FIG. 29A, the sensor device 500 (physical quantity transducer) detects the physical quantity (e.g., force, acceleration, or mass). The sensor device 500 converts the physical quantity into a current (charge), a voltage, or the like, and outputs the current, voltage, or the like as a detection signal. The sensor device 500 includes a sensor 502 and a detection circuit 504. Note that the sensor device 500 may not include the detection circuit 504.

The integrated circuit device 510 receives the detection signal from the sensor device 500, subjects the detection signal to A/D conversion, and optionally performs a calculation process (signal processing) on digital data obtained by A/D conversion. The integrated circuit device 510 outputs the resulting digital data to a system (system board or system device such as a CPU) in the subsequent stage.

According to the first configuration example shown in FIG. 29A, various electronic instruments that include a smoke sensor, an optical sensor, a human detection sensor, a pressure sensor, a biosensor, a gyrosensor, and the like can be implemented.

Figure 29B:
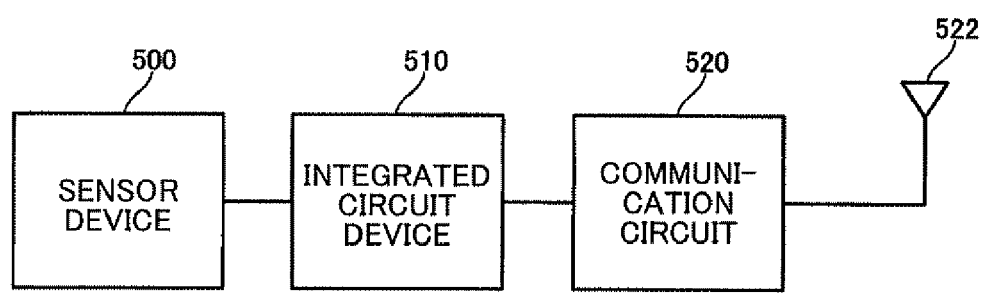

FIG. 29B shows a second configuration example of the electronic instrument according to this embodiment. In the second configuration example, a communication circuit (radio circuit) 520 and an antenna 522 are provided in addition to the elements of the first configuration example shown in FIG. 29A. The communication circuit 520 performs a modulation process and the like on the digital data from the integrated circuit device 510, and transmits the resulting data to an external instrument (target-side electronic instrument) using the antenna 522. The communication circuit 520 may receive data from an external instrument using the antenna 522, and perform an ID authentication process or control the sensor device 500, for example.

According to the second configuration example shown in FIG. 29B, electronic instruments such as an IC tag (RF tag) used for radio frequency identification (RFID) that writes and reads data in a contactless manner utilizing wireless communication can be implemented in addition to the electronic instruments that can be implemented by the first configuration example shown in FIG. 29A, for example.

Figure 29C:
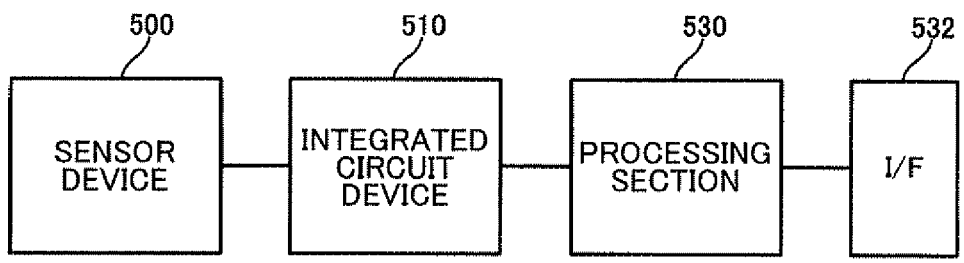

FIG. 29C shows a third configuration example of the electronic instrument according to this embodiment. The electronic instrument shown in FIG. 29C includes a processing section 530 and an interface (I/F) 532 in addition to the elements of the first configuration example shown in FIG. 29A. The processing section 530 receives the digital data from the integrated circuit device 510, and performs various processes. The I/F 532 performs data transfer conforming to the USBA standard, the IEEE 1394 standard, or the like to and from an external instrument such as a personal computer (PC).

According to the third configuration example shown in FIG. 29C, electronic instruments such as an evaluation device (evaluation board) used for development and trial production of the sensor device 500 can be implemented in addition to the electronic instruments that can be implemented by the first and second configuration examples shown in FIGS. 29A and 29B.

Although some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g., amplifiers AM1 to AM3 and D/A converters DAC1 to DAC3) cited with a different term (e.g., first to Nth amplifiers and first to Nth D/A converters) having a broader meaning or the same meaning at least once in the specification and the drawings may be replaced by the different term in any place in the specification and the drawings. The configurations and the operations of the integrated circuit device and the electronic instrument are not limited to those described with reference to the above embodiments. Various modifications and variations may be made.

What is claimed is:

1. An integrated circuit device comprising:
   an amplifier circuit that receives an input signal and performs an offset adjustment corresponding to a DC offset of the input signal and a gain adjustment corresponding to an amplitude of the input signal;
   a filter that is provided in a subsequent stage of the amplifier circuit, a cut-off frequency of the filter being variably set corresponding to a frequency band of the input signal;
   an A/D converter that is provided in a subsequent stage of the filter and performs an A/D conversion process on a signal amplified by the amplifier circuit; and
   a control circuit that sets an offset adjustment of the amplifier circuit, a gain adjustment of the amplifier circuit, and the cut-off frequency of the filter.

2. The integrated circuit device as defined in claim 1,
   first to Mth (M is an integer equal to or larger than two) amplifier circuits being provided as the amplifier circuit, the first to Mth amplifier circuits respectively receiving first to Mth input signals, each of the first to Mth amplifier circuits performing an offset adjustment corresponding to a DC offset of a corresponding input signal among the first to Mth input signals and a gain adjustment corresponding to an amplitude of a corresponding input signal among the first to Mth input signals;
   first to Mth filters being provided as the filter, cut-off frequencies of the first to Mth filters being variably set corresponding to frequency bands of the first to Mth input signals, respectively; and
   the integrated circuit device further comprising a multiplexer that selects an output signal from output signals from the first to Mth filters and outputs the selected output signal to the A/D converter as a multiplexer output signal.

3. The integrated circuit device as defined in claim 1,
   the amplifier circuit performing a filter process on the input signal as a continuous-time filter; and
   the filter being a switched-capacitor filter that performs a filter process using the continuous-time filter as a prefilter.

4. The integrated circuit device as defined in claim 3,
   when a sampling frequency of the switched-capacitor filter is referred to as $fck1$, a cut-off frequency of the switched-capacitor filter is referred to as $fc1$, a resolution of the A/D converter is n bits, and an attenuation factor of the continuous-time filter at a frequency $fck1-fc1$ is $AT1$ dB, the relationship "$AT1 \leq 20 \times \log(1/2^n)$" being satisfied.

5. The integrated circuit device as defined in claim 3,
   a cut-off frequency $fc0$ of the continuous-time filter being fixed; and
   a cut-off frequency $fc1$ of the switched-capacitor filter being variably set.

6. The integrated circuit device as defined in claim 3,
   a sampling frequency $fck1$ of the switched-capacitor filter being fixed; and
   a cut-off frequency $fc1$ of the switched-capacitor filter being variably set.

7. The integrated circuit device as defined in claim 6,
   the cut-off frequency $fc1$ of the switched-capacitor filter being variably set by changing a capacitance ratio of a plurality of capacitors included in the switched-capacitor filter.

8. The integrated circuit device as defined in claim 3,
   the control circuit including a digital filter that performs a digital filter process using the continuous-time filter and the switched-capacitor filter as prefilters, a cut-off frequency of the digital filter being variably set corresponding to the frequency band of the input signal.

9. The integrated circuit device as defined in claim 8,
   when a cut-off frequency of the continuous-time filter is referred to as $fc0$, a cut-off frequency of the switched-capacitor filter is referred to as $fc1$, and the cut-off frequency of the digital filter is referred to as $fc2$, the relationship "$fc0 > fc1 > fc2$" being satisfied.

10. The integrated circuit device as defined in claim 8,
    when a sampling frequency of the digital filter is referred to as $fck2$, the cut-off frequency of the digital filter is referred to as $fc2$, and a resultant attenuation factor of the continuous-time filter and the switched-capacitor filter at a frequency $fck2-fc2$ is $AT2$ dB, the relationship "$AT2 \leq 20 \times \log(1/2^n)$" being satisfied.

11. The integrated circuit device as defined in claim 8,
    a sampling frequency $fck2$ of the digital filter being set so that the sampling frequency $fck2$ decreases as a cut-off frequency $fc1$ of the switched-capacitor filter decreases.

12. The integrated circuit device as defined in claim 11,
    a cut-off frequency $fc2$ of the digital filter being set so that the cut-off frequency $fc2$ decreases as the frequency band of the input signal decreases.

13. The integrated circuit device as defined in claim 1,
    the amplifier circuit including first to Nth (N is an integer equal to or larger than two) amplifiers that are cascaded;
    the integrated circuit device further comprising first to Nth D/A converters that are provided corresponding to the first to Nth amplifiers and used to perform an offset adjustment of the first to Nth amplifiers; and
    the control circuit setting an offset adjustment of the first to Nth amplifiers using the first to Nth D/A converters and setting a gain adjustment of the first to Nth amplifiers.

14. The integrated circuit device as defined in claim 13,
    an output range $QR1$ of an ith (i is an integer that satisfies $1 \leq i < N$) D/A converter among the first to Nth D/A converters being wider than an output range $QR2$ of an (i+1)th D/A converter among the first to Nth D/A converters that is provided in a subsequent stage of the ith D/A converter.

15. The integrated circuit device as defined in claim 14,
    when a gain of an ith amplifier among the first to Nth amplifiers is referred to as $G1$ and a 1LSB-equivalent voltage of the ith D/A converter is referred to as VLSB1, QR2≧G1×VLSB1 being satisfied.

16. The integrated circuit device as defined in claim 13, a 1LSB-equivalent voltage VLSB1 of an ith (i is an integer that satisfies 1≦i<N) D/A converter among the first to Nth D/A converters being higher than a 1LSB-equivalent voltage VLSB2 of an (i+1)th D/A converter among the first to Nth D/A converters that is provided in a subsequent stage of the ith D/A converter.

17. An electronic instrument comprising the integrated circuit device as defined in claim 1.

* * * * *